United States Patent
Anderson et al.

(10) Patent No.: US 7,101,763 B1
(45) Date of Patent: Sep. 5, 2006

(54) LOW CAPACITANCE JUNCTION-ISOLATION FOR BULK FINFET TECHNOLOGY

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,556

(22) Filed: May 17, 2005

(51) Int. Cl.
 *H01L 21/336* (2006.01)
 *H01L 29/38* (2006.01)

(52) U.S. Cl. .............. 438/285; 438/224; 257/374; 257/E27.067; 257/E29.105; 257/E21.546

(58) Field of Classification Search ........ 257/328, 257/347, 350, 351, 369, 19, 63, 65, 183; 438/199, 218–232, 149, 479
See application file for complete search history.

(56) References Cited

U.S. PATENT DOCUMENTS

| | | | |
|---|---|---|---|
| 6,642,090 B1 | 11/2003 | Fried et al. | |
| 6,762,448 B1 | 7/2004 | Lin et al. | |
| 6,787,854 B1 * | 9/2004 | Yang et al. | 257/348 |
| 2004/0129995 A1 | 7/2004 | Yeo et al. | |
| 2004/0198031 A1 | 10/2004 | Lin et al. | |
| 2004/0209463 A1 | 10/2004 | Kim et al. | |
| 2004/0219722 A1 * | 11/2004 | Pham et al. | 438/157 |
| 2004/0227187 A1 | 11/2004 | Cheng et al. | |
| 2004/0235300 A1 | 11/2004 | Mathew et al. | |
| 2005/0035415 A1 * | 2/2005 | Yeo et al. | 257/401 |
| 2005/0184360 A1 * | 8/2005 | Ho et al. | 257/565 |
| 2005/0191795 A1 * | 9/2005 | Chidambarrao et al. | 438/142 |
| 2005/0280090 A1 * | 12/2005 | Anderson et al. | 257/347 |

\* cited by examiner

*Primary Examiner*—Eddie Lee
*Assistant Examiner*—Andrew O. Arena
(74) *Attorney, Agent, or Firm*—Scully, Scott, Murphy & Presser, P.C.; William D. Sabo, Esq.

(57) ABSTRACT

The present invention provides a SiGe-based bulk integration scheme for generating FinFET devices on a bulk Si substrate in which a simple etch, mask, ion implant set of sequences have been added to accomplish good junction isolation while maintaining the low capacitance benefits of FinFETs. The method of the present invention includes providing a structure including a bottom Si layer and a patterned stack comprising a SiGe layer and a top Si layer on the bottom Si layer; forming a well region and isolation regions via implantation within the bottom Si layer; forming an undercut region beneath the top Si layer by etching back the SiGe layer; and filling the undercut with a dielectric to provide device isolation, wherein the dielectric has an outer vertical edge that is aligned to an outer vertical edge of the top Si layer.

20 Claims, 30 Drawing Sheets

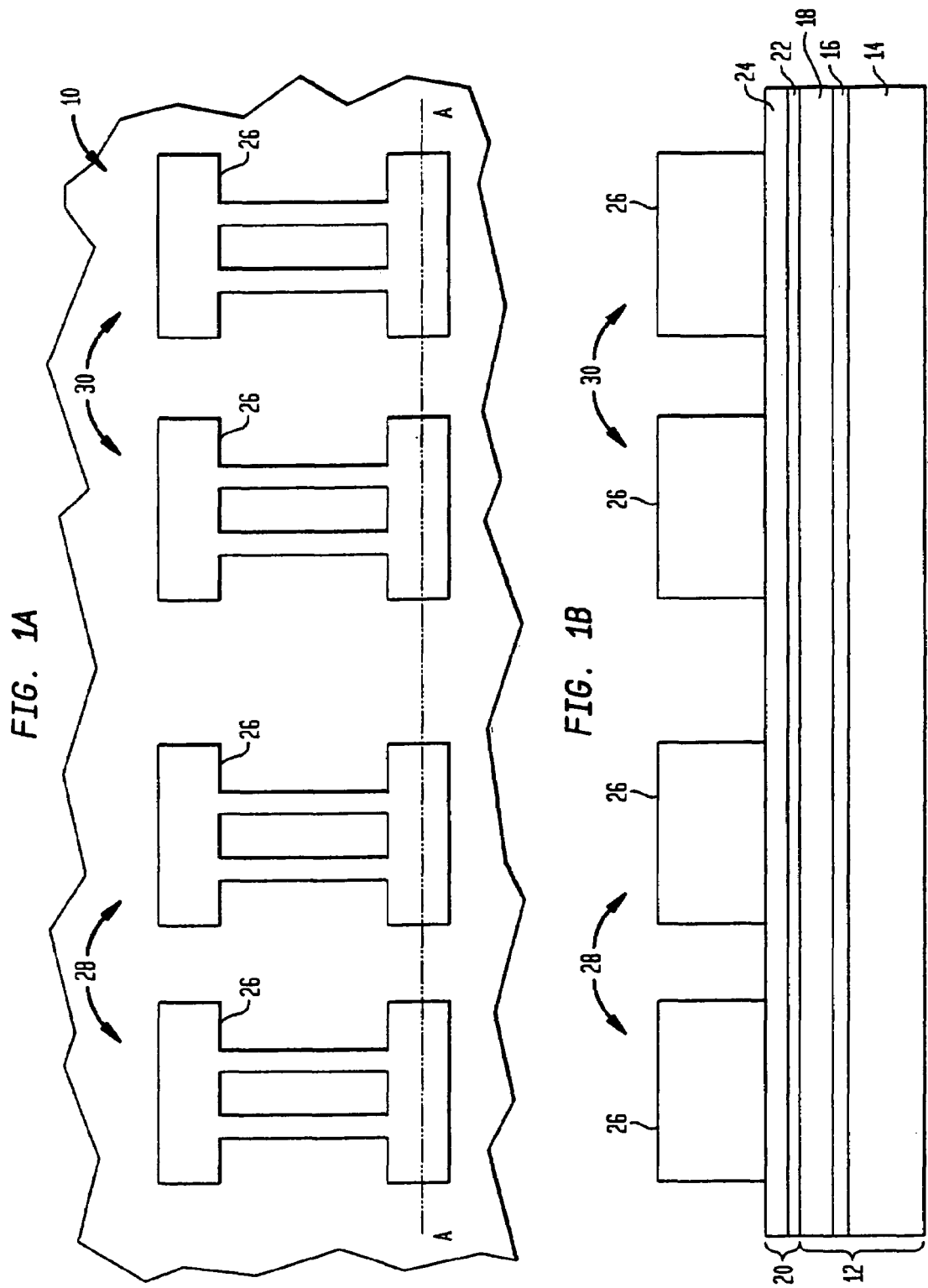

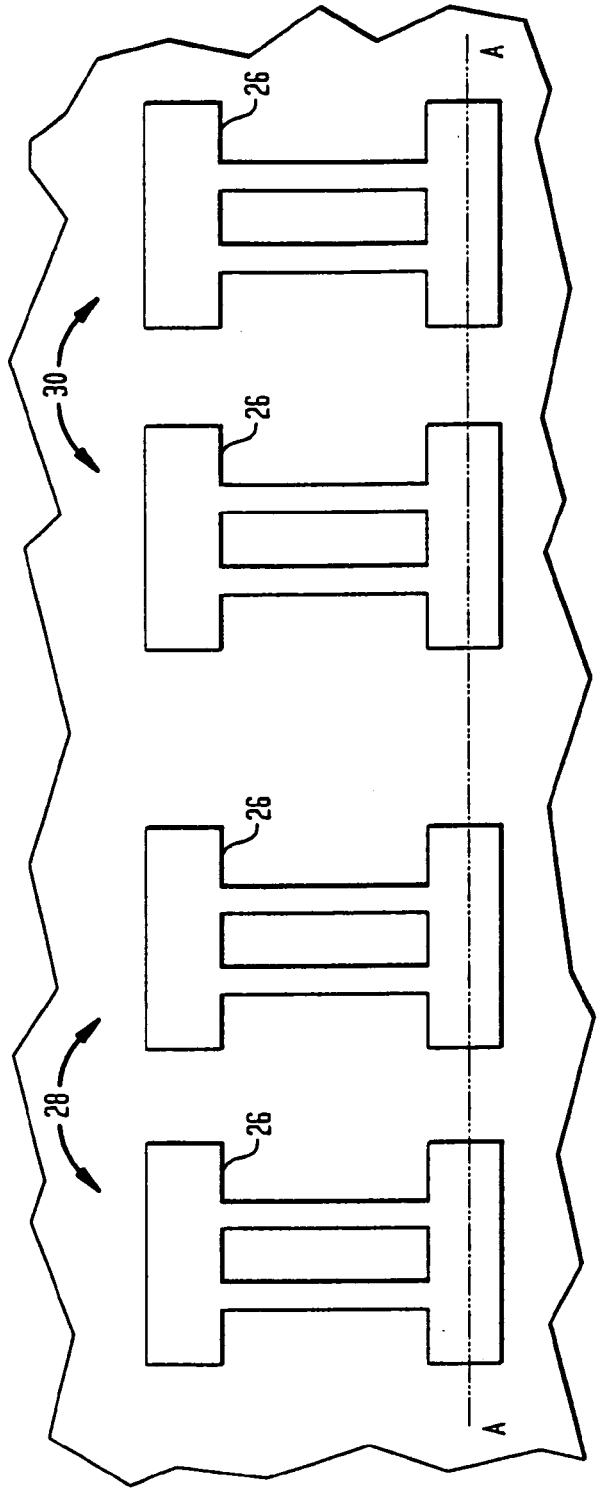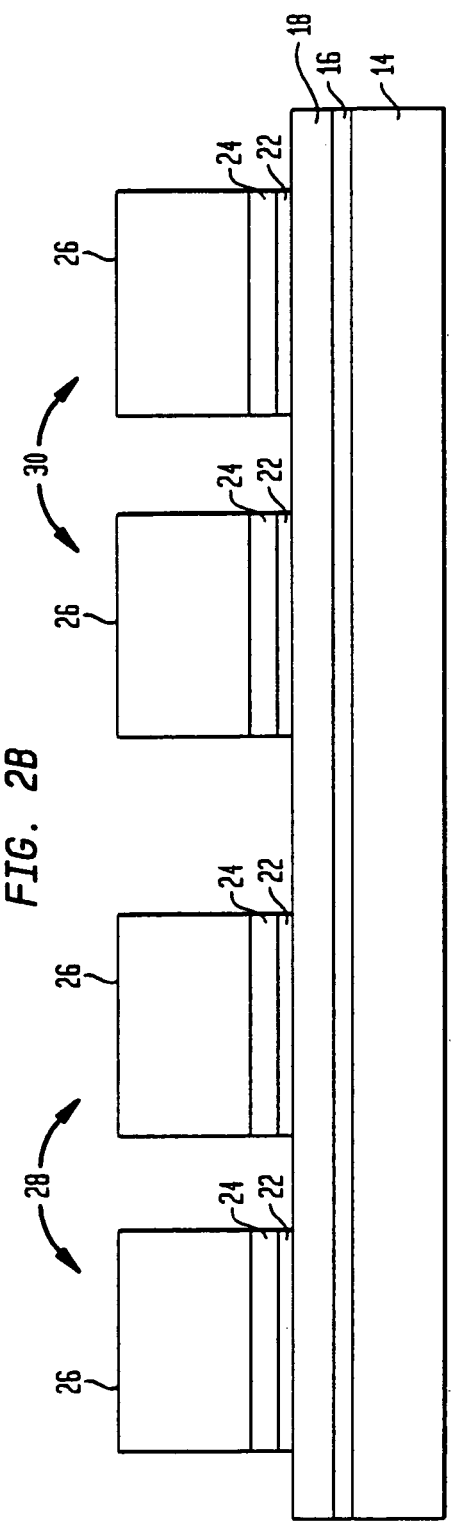

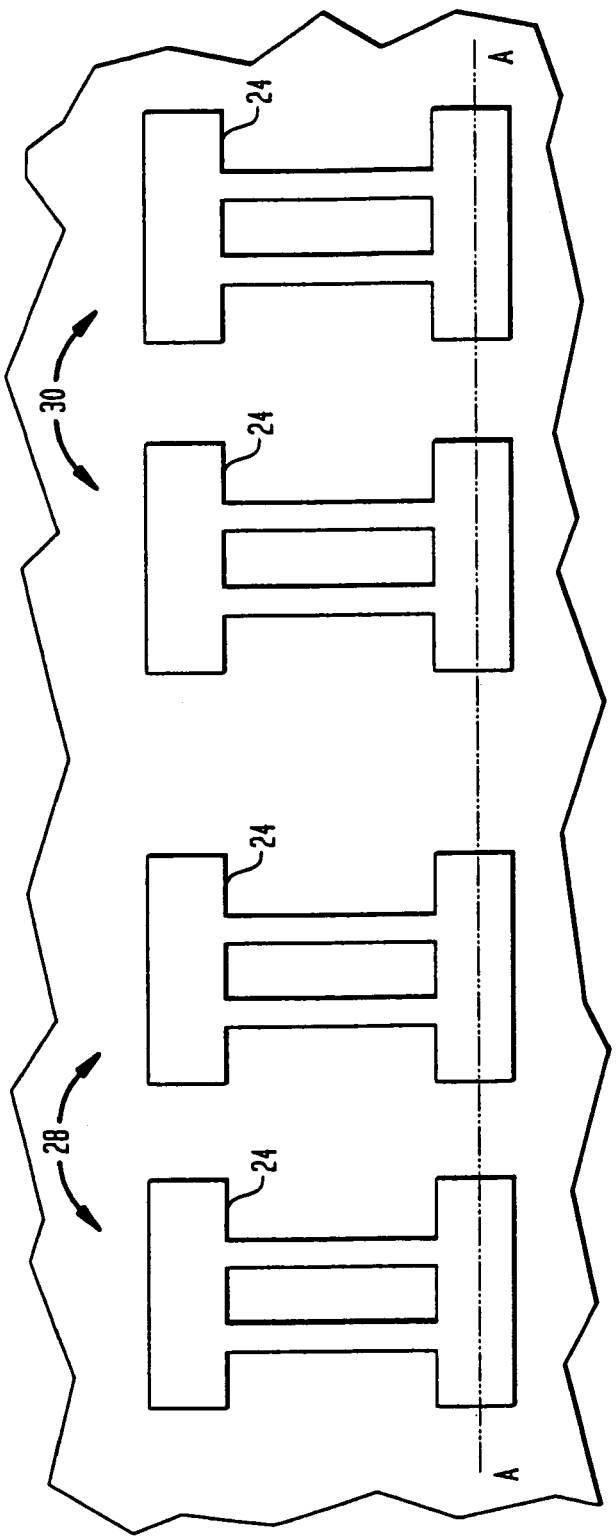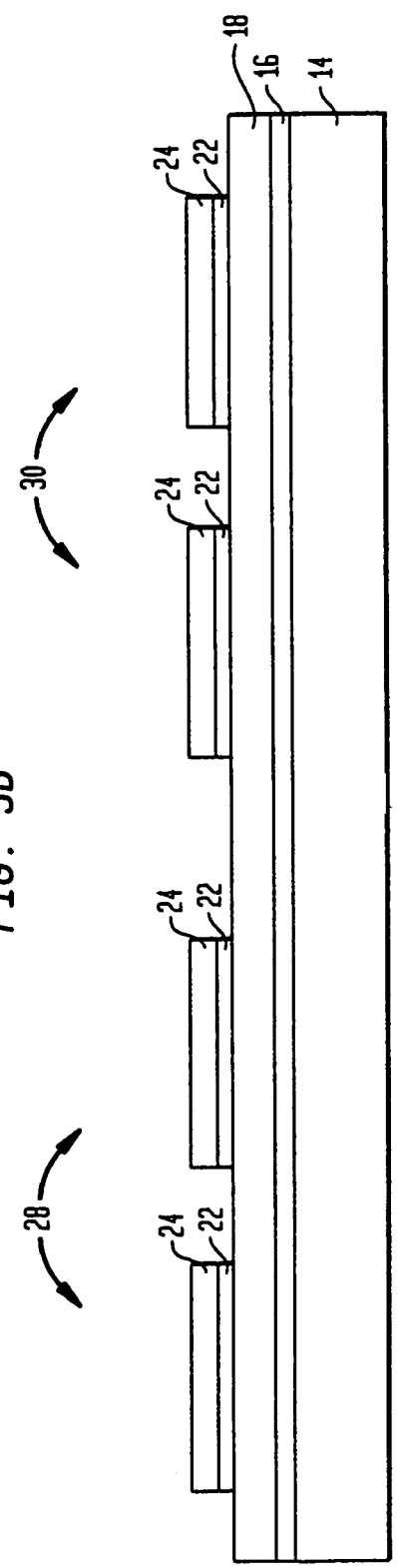
FIG. 3A
FIG. 3B

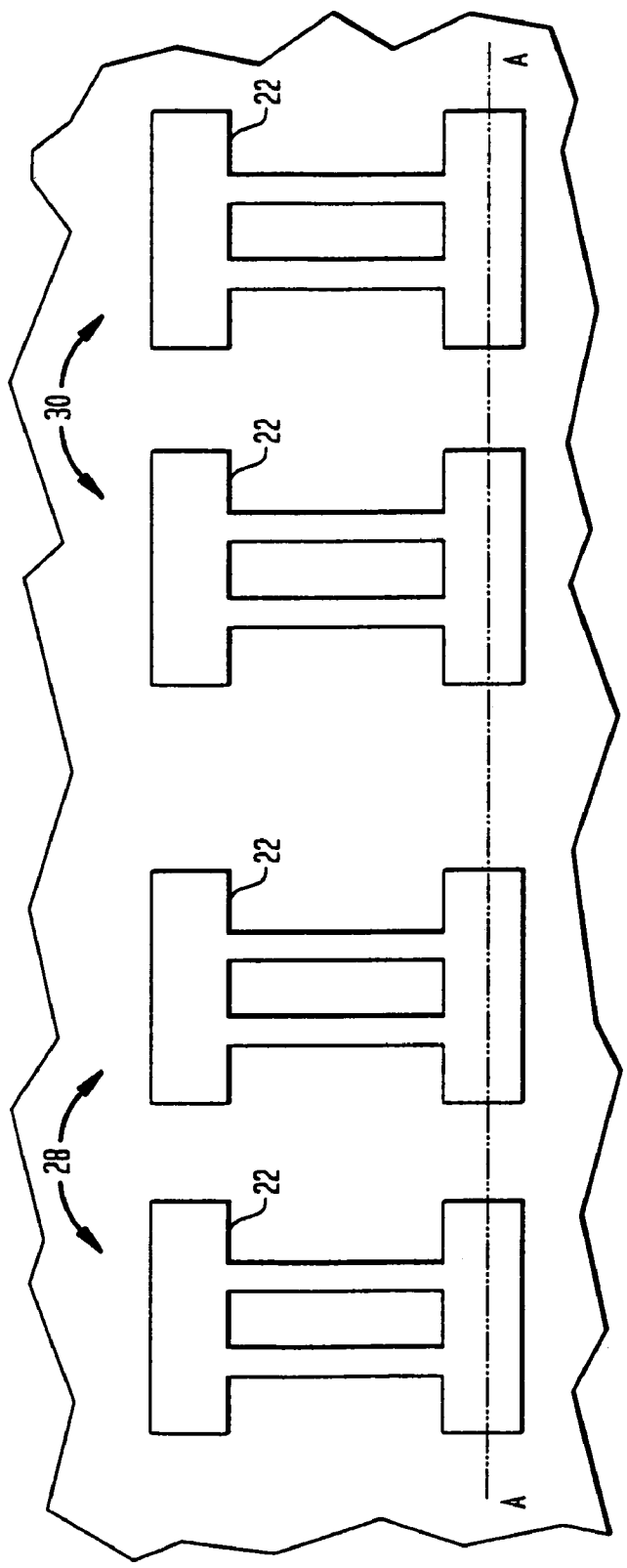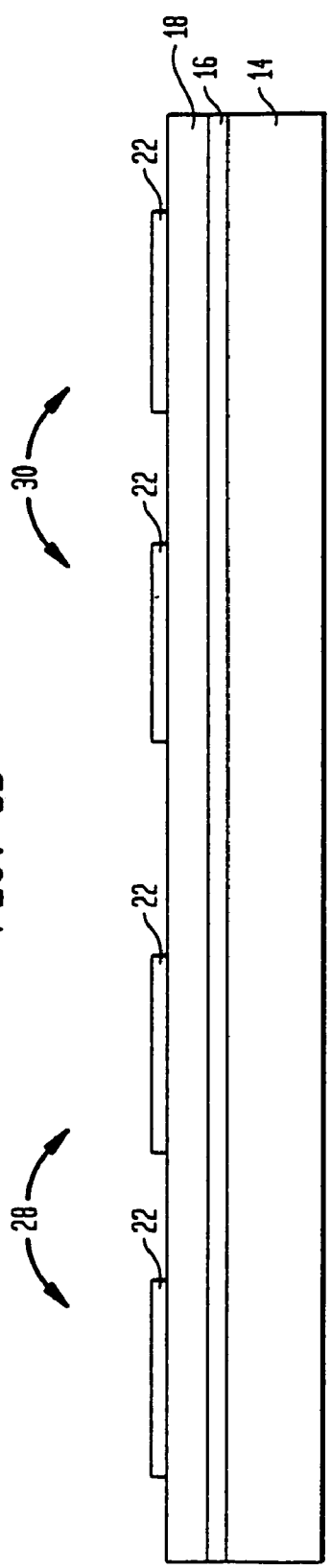

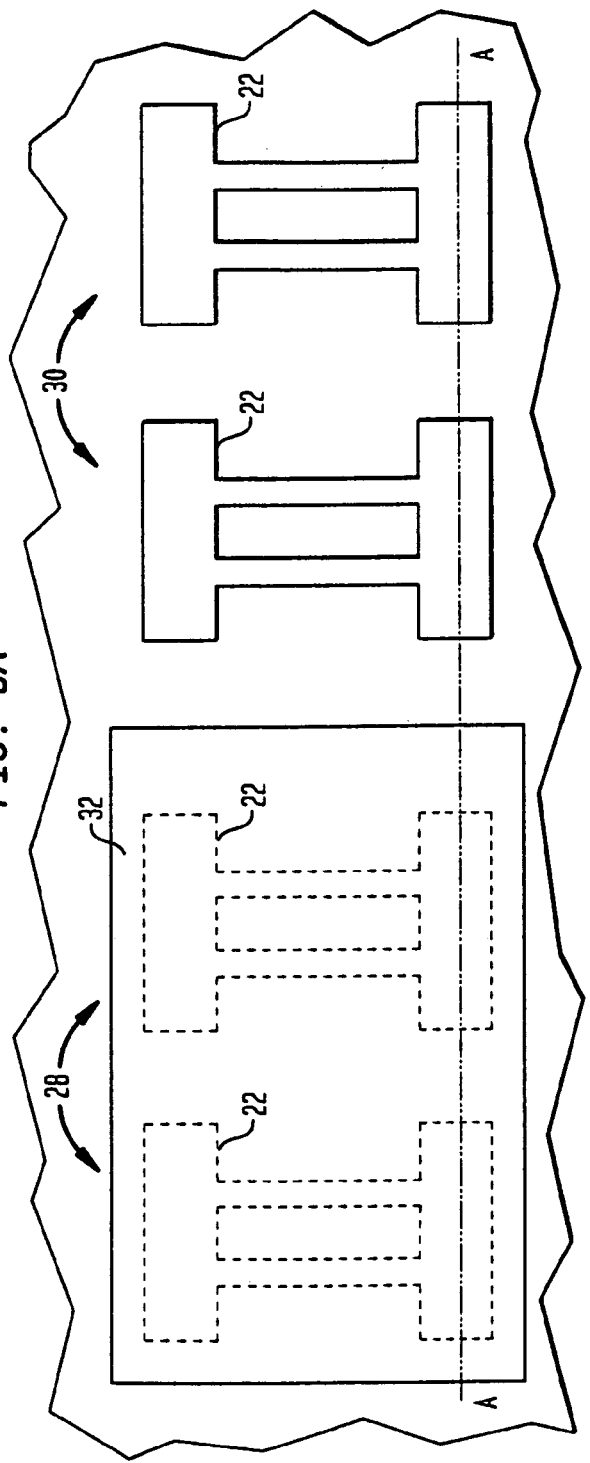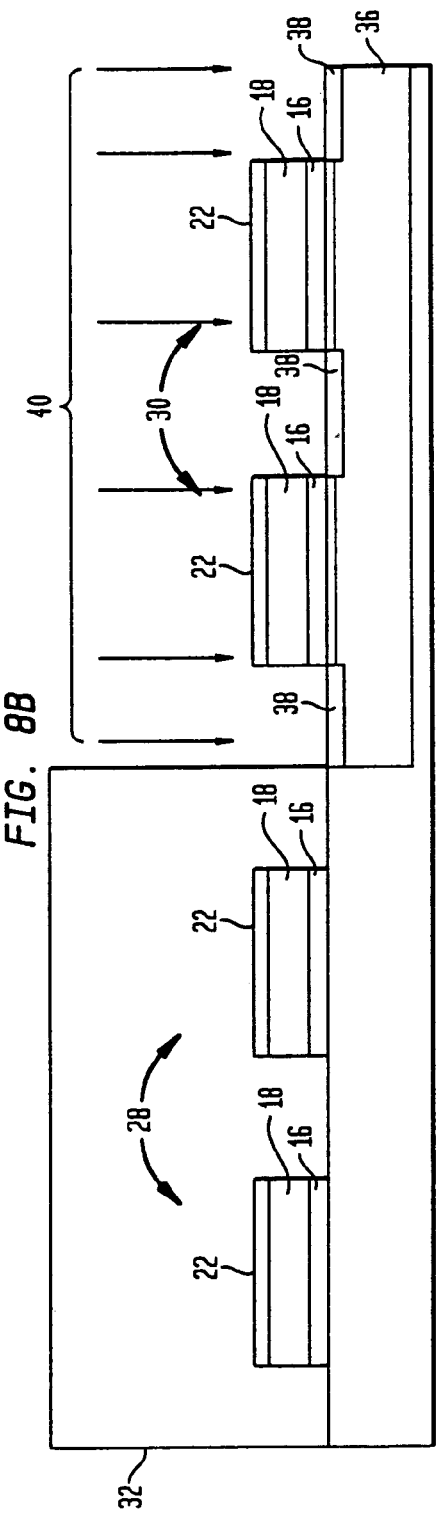

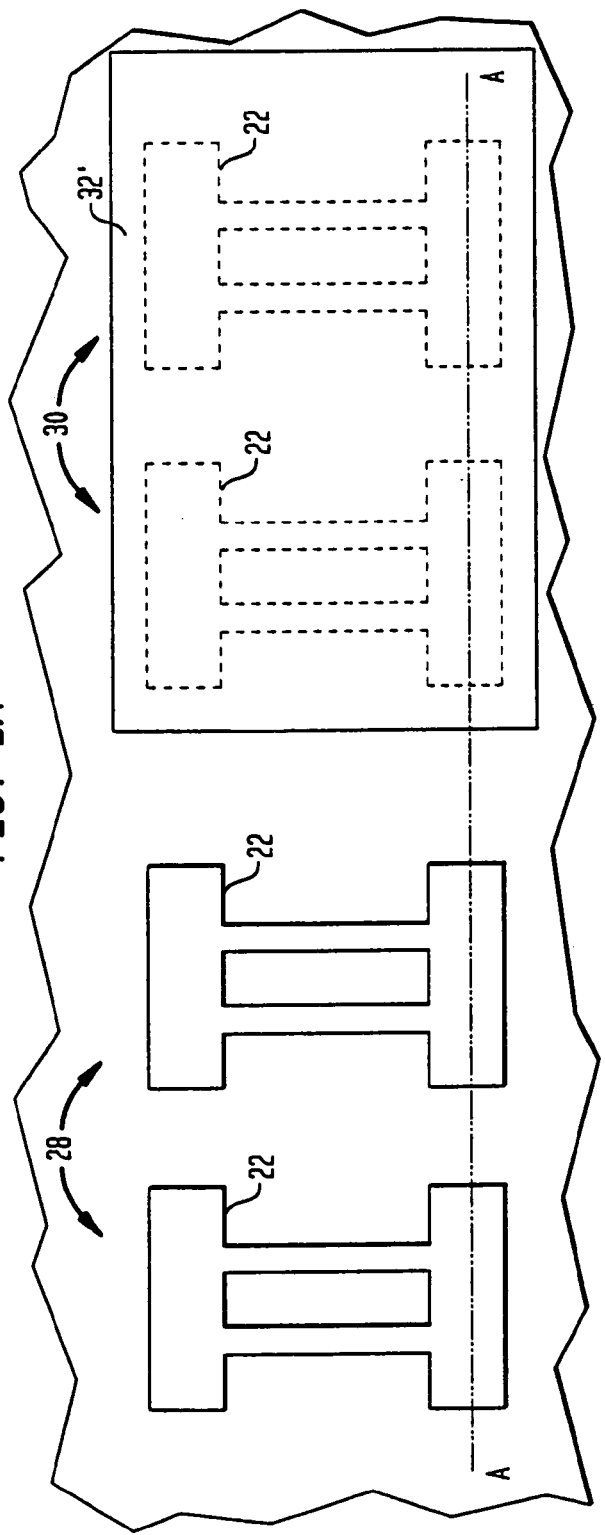
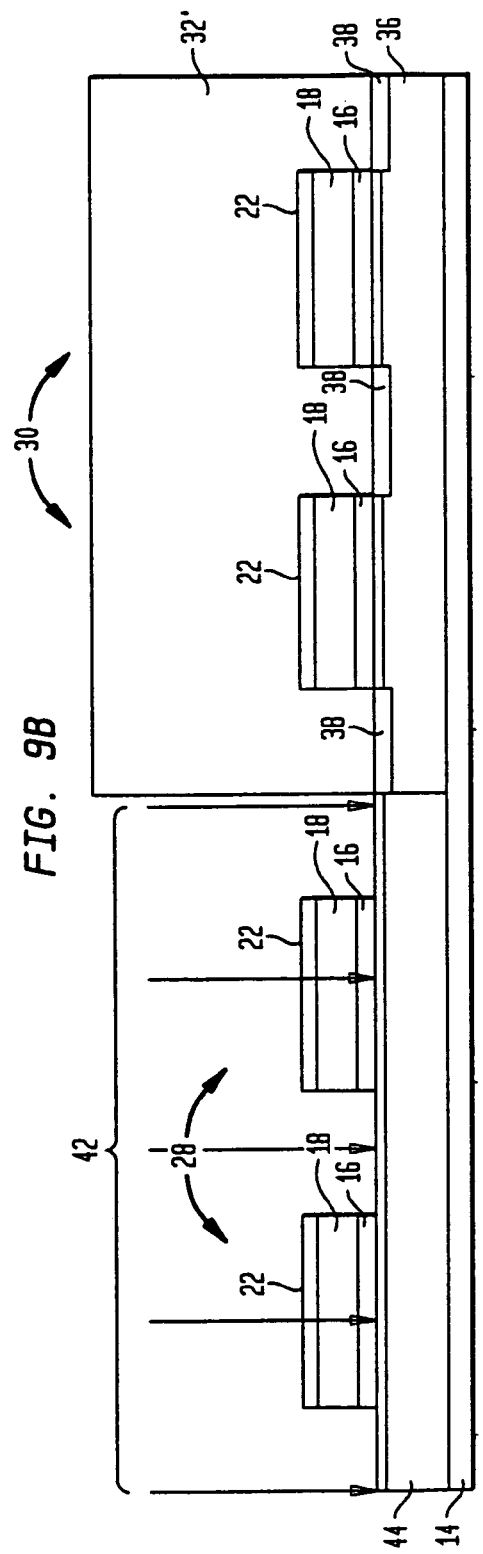
FIG. 9A
FIG. 9B

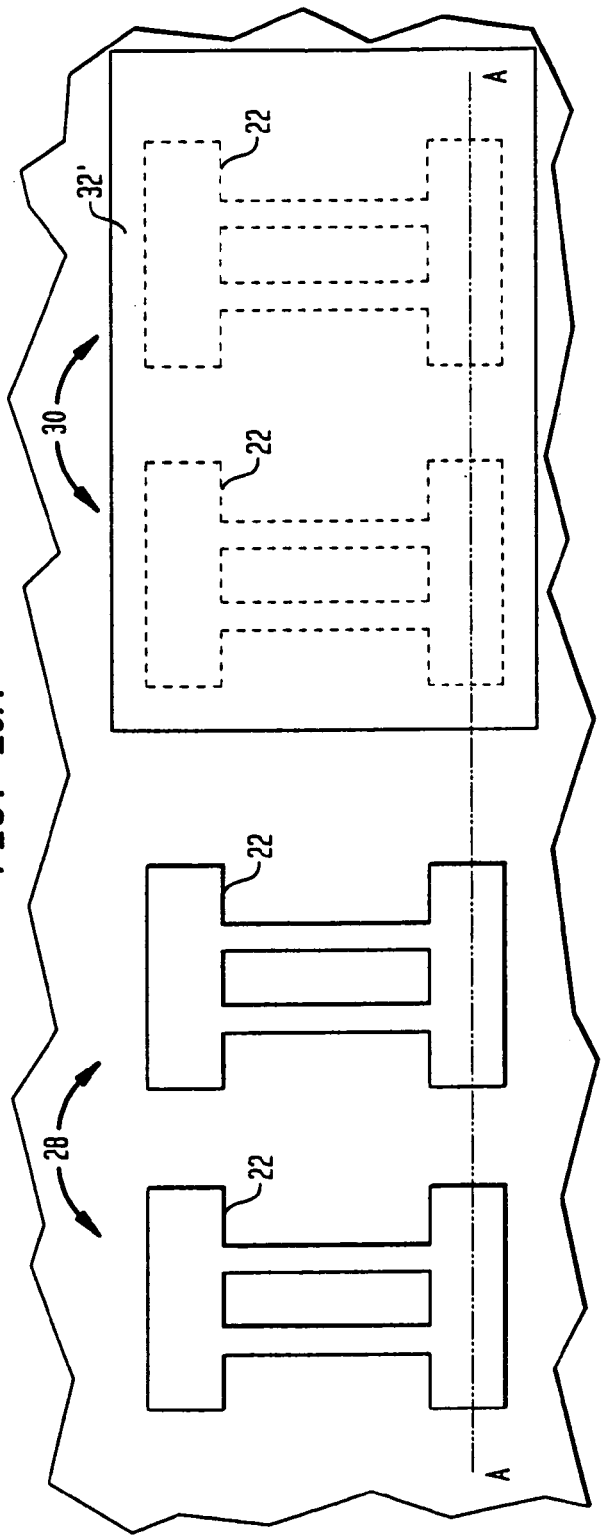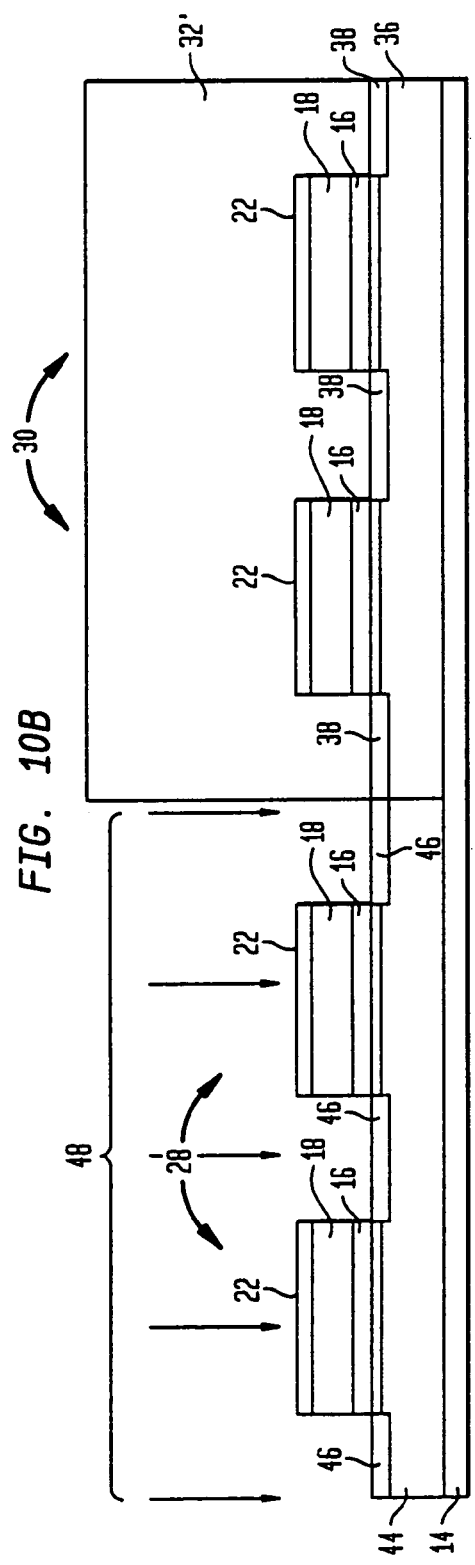
FIG. 10A
FIG. 10B

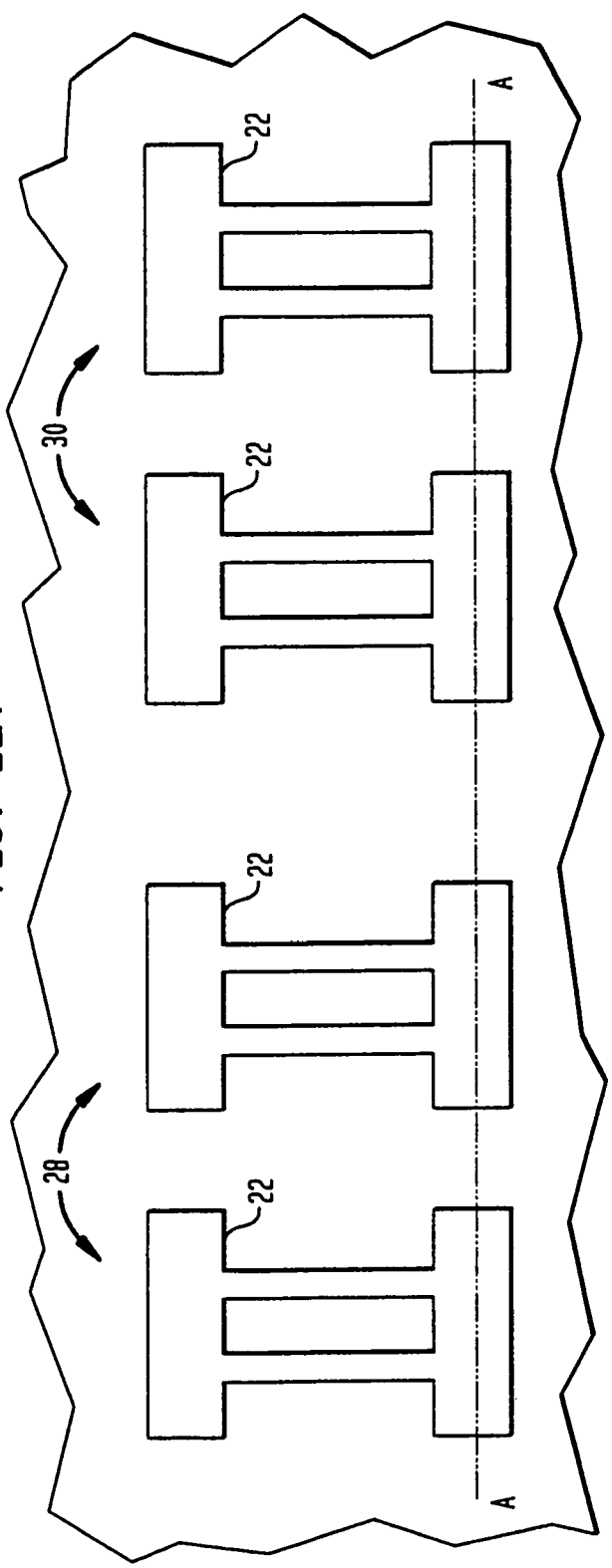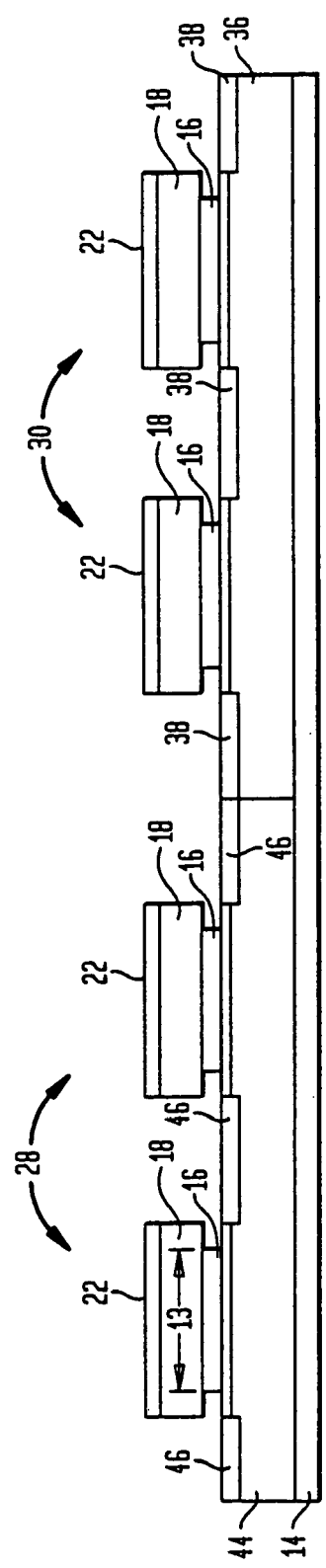
FIG. 11A
FIG. 11B

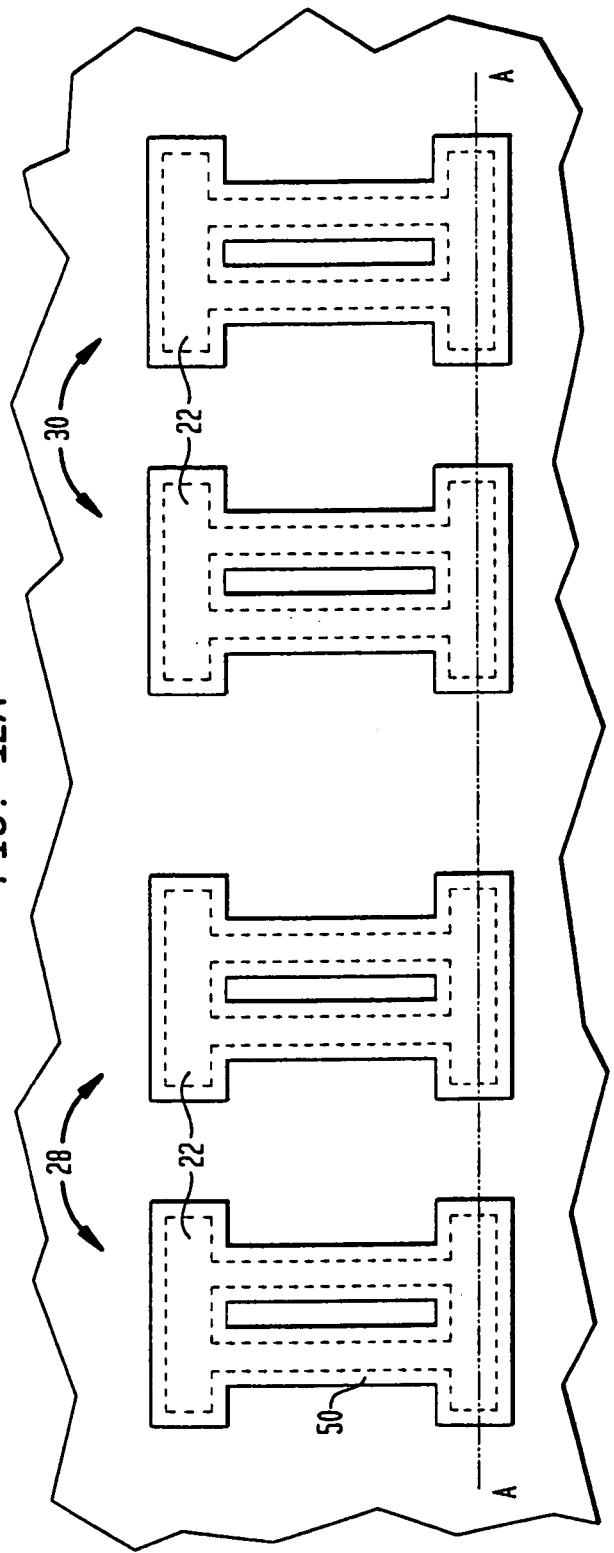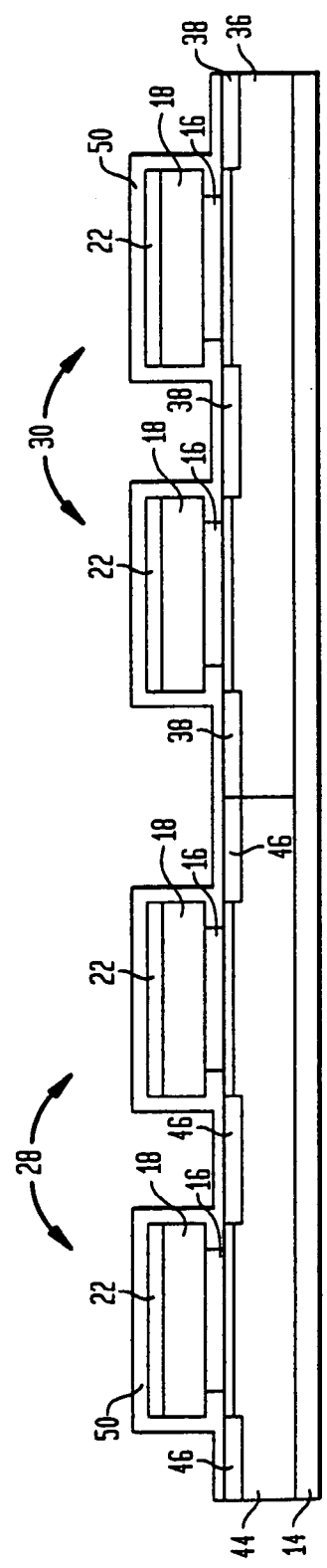

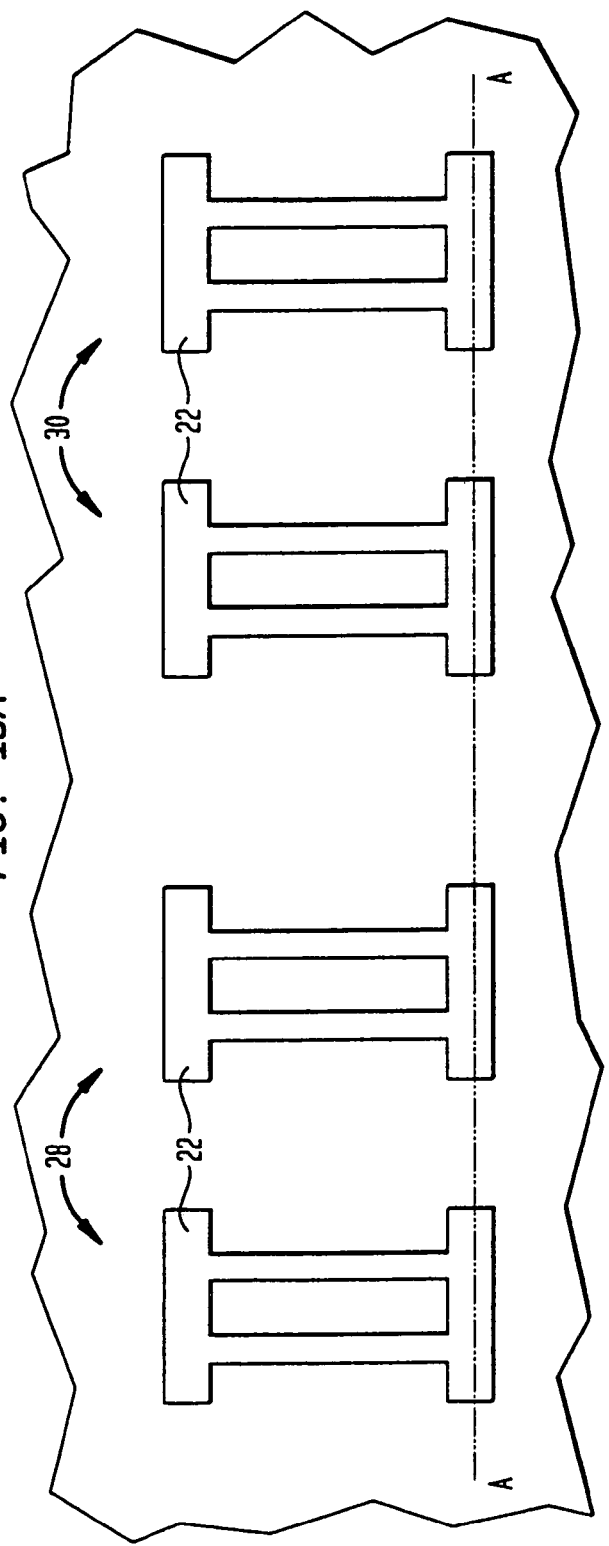
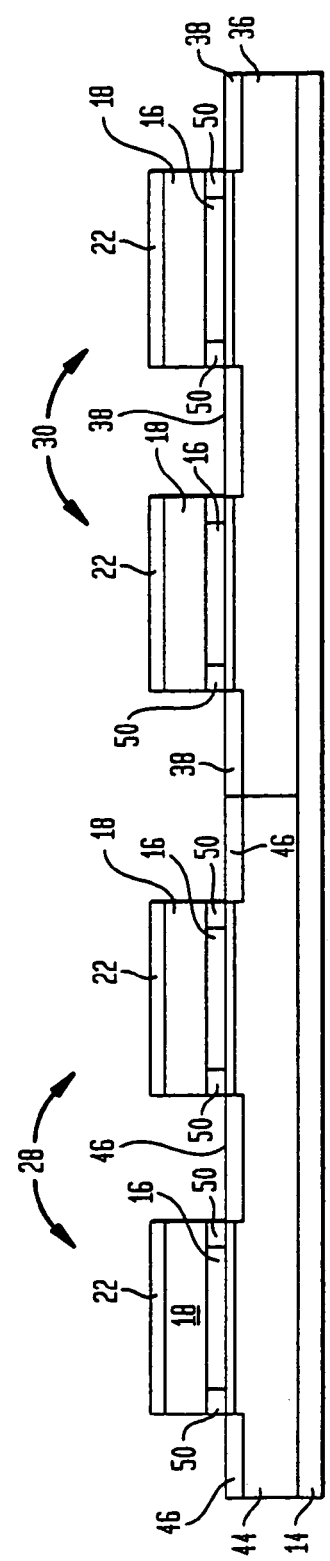
FIG. 13A
FIG. 13B

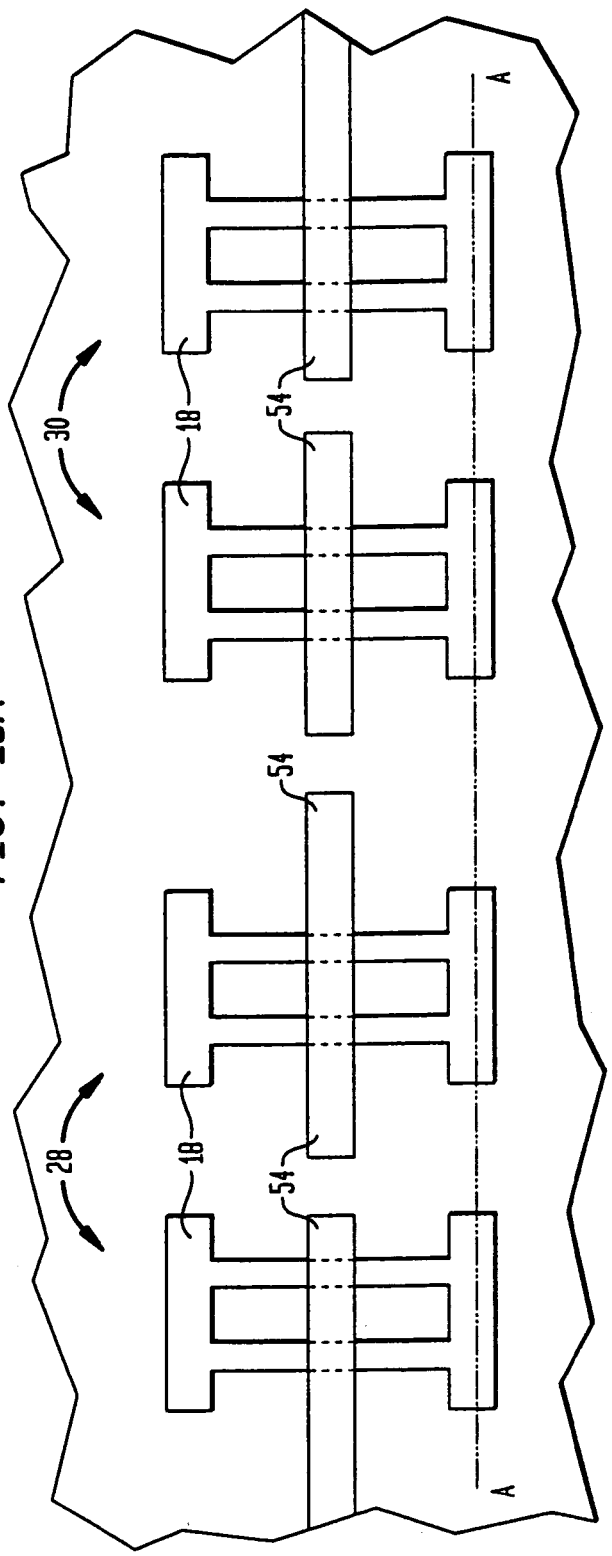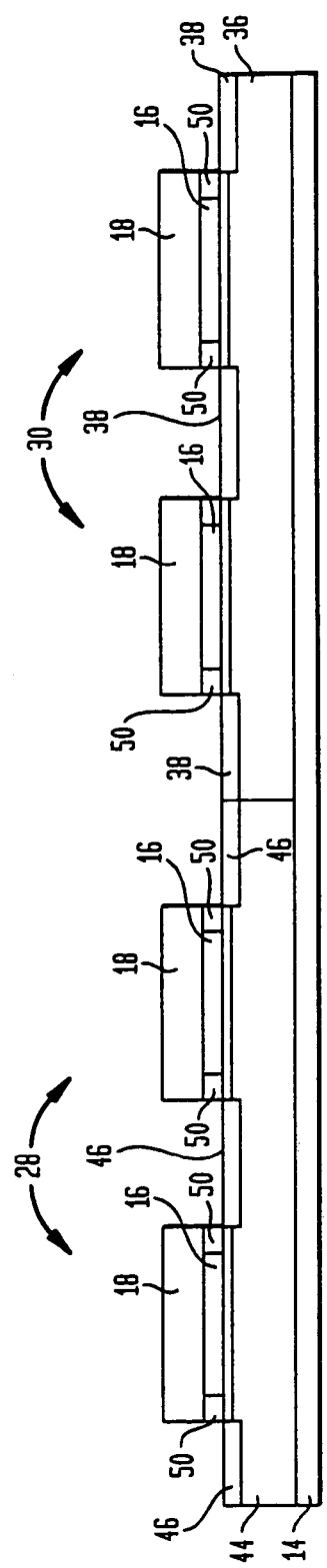
FIG. 15A
FIG. 15B

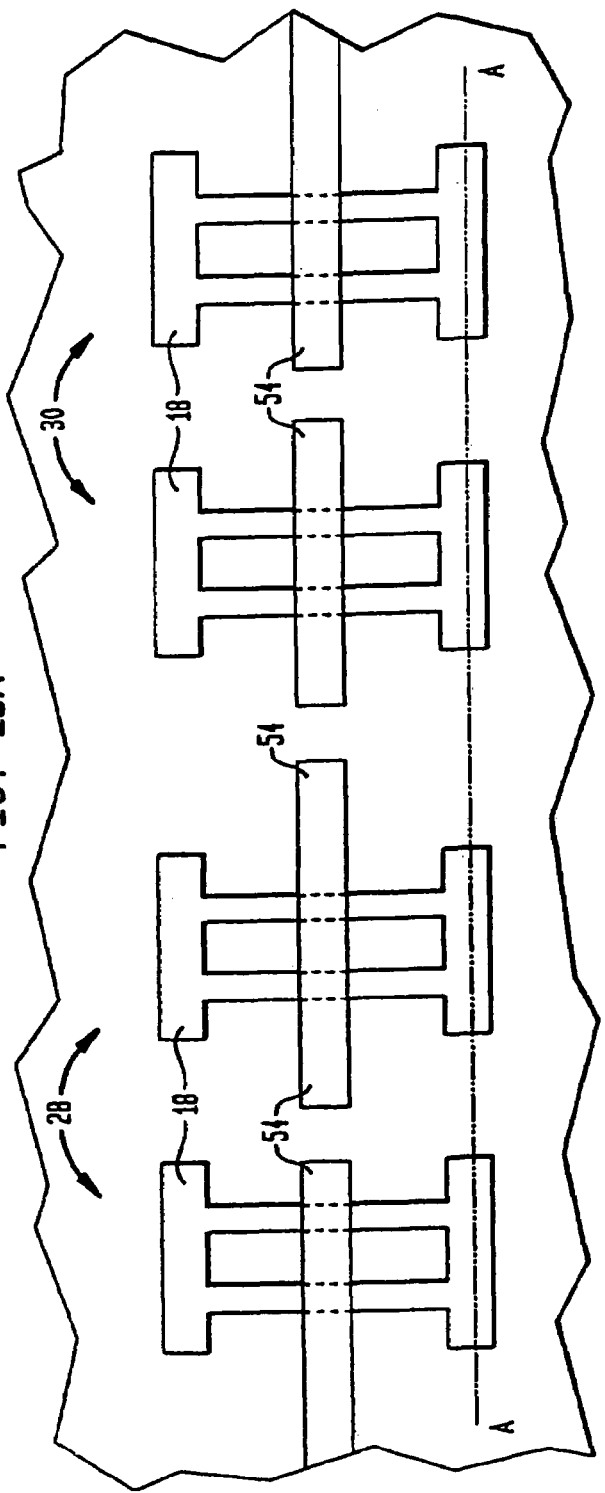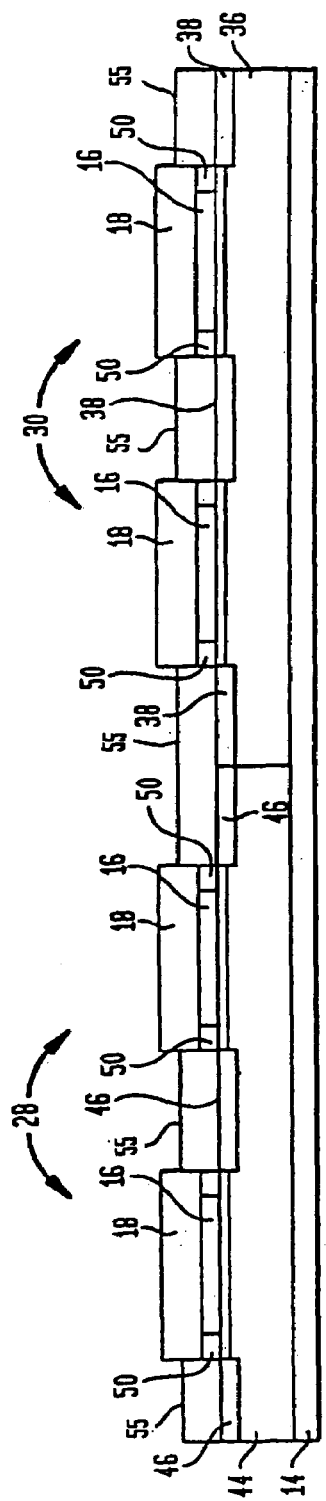

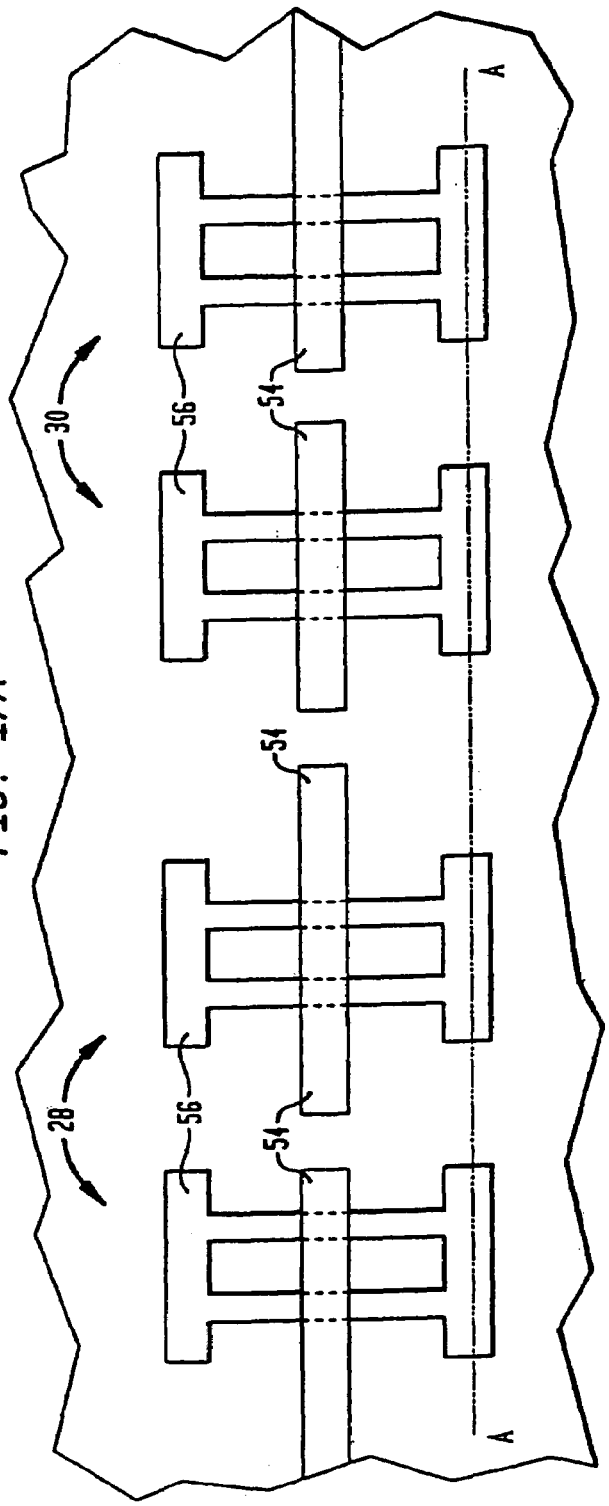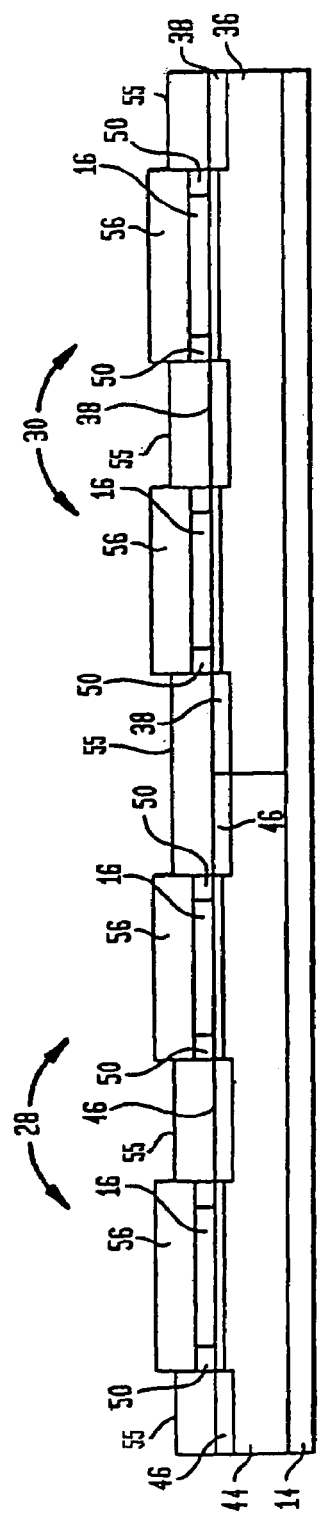
FIG. 17A
FIG. 17B

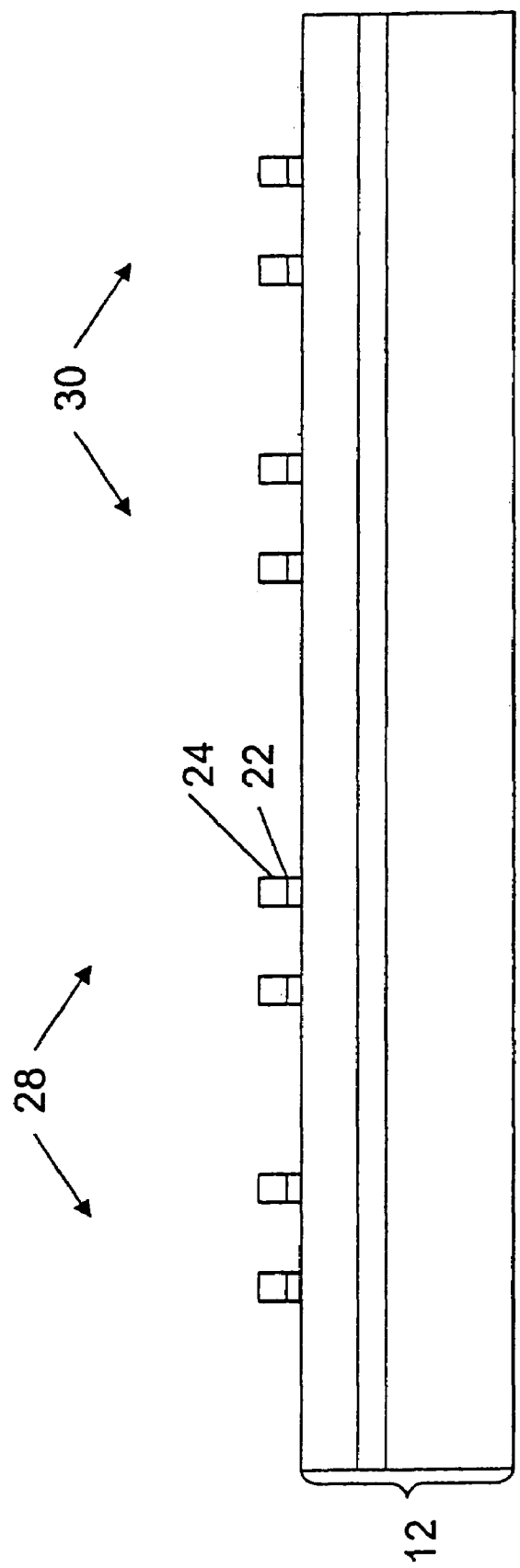

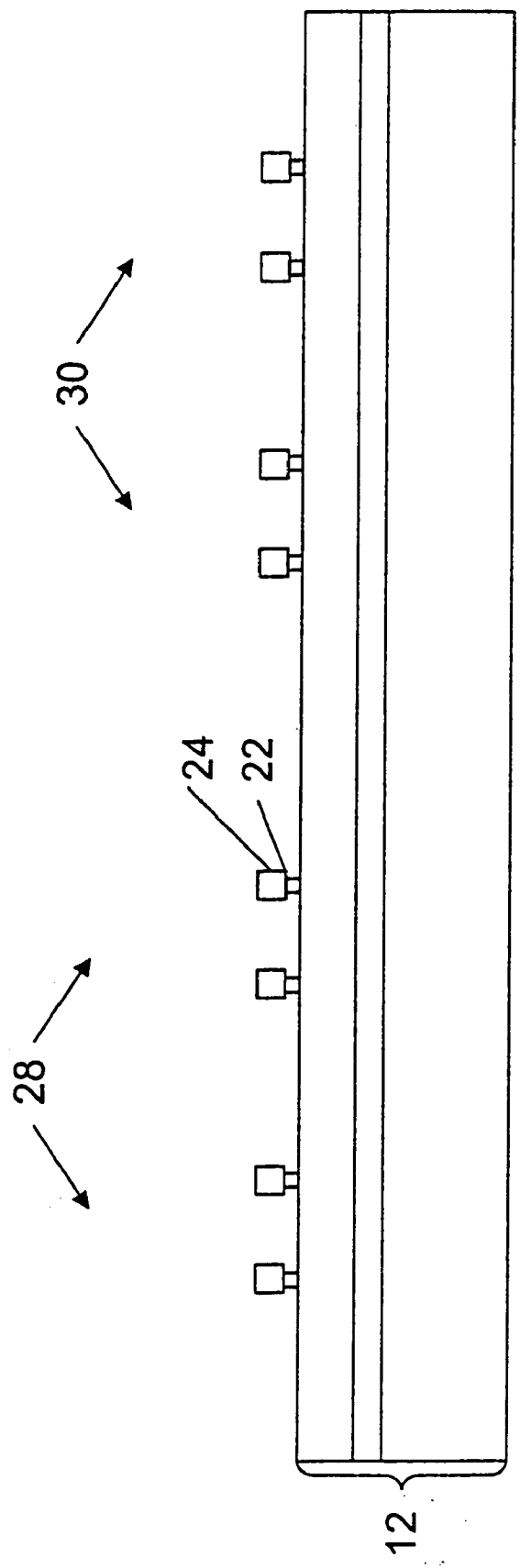

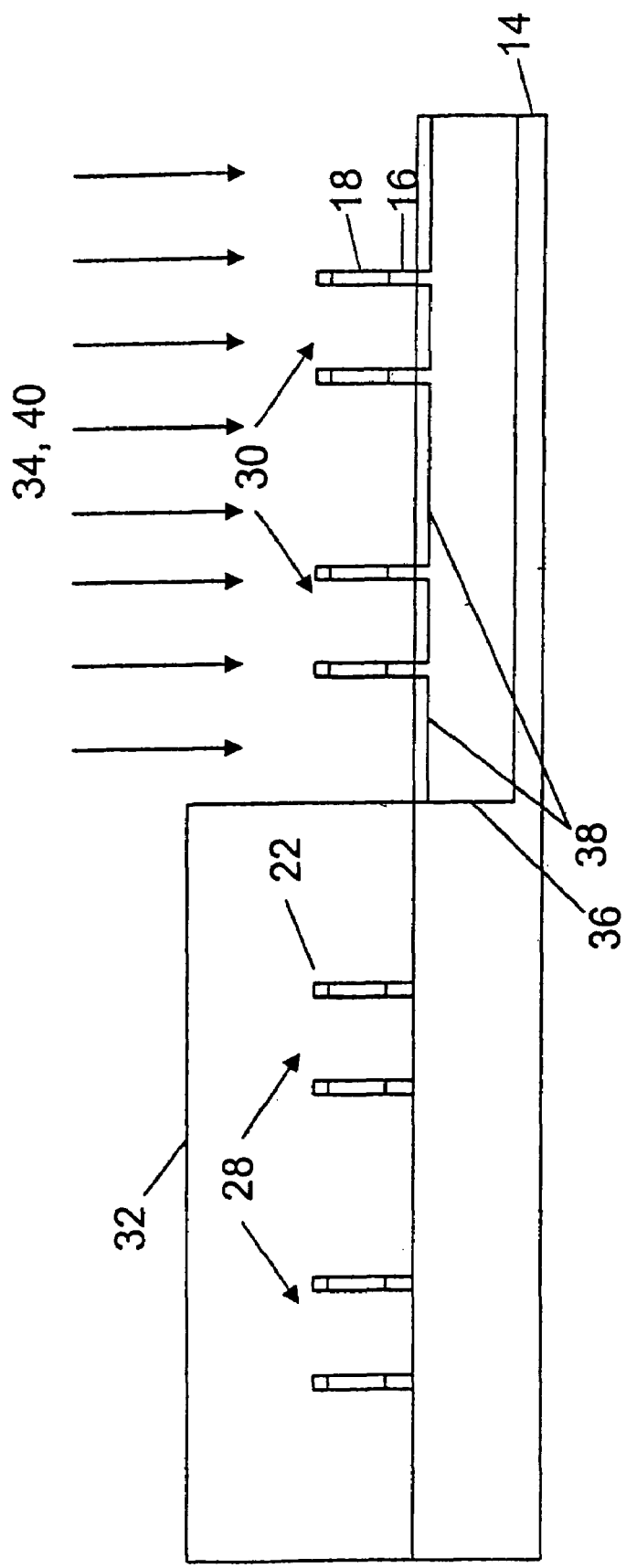

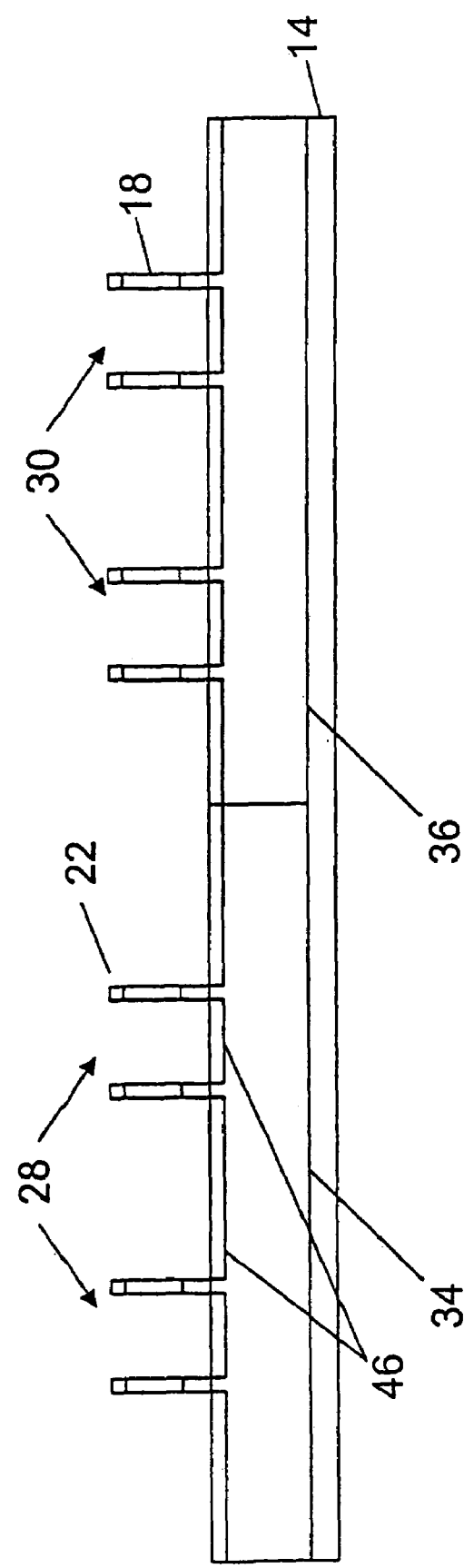

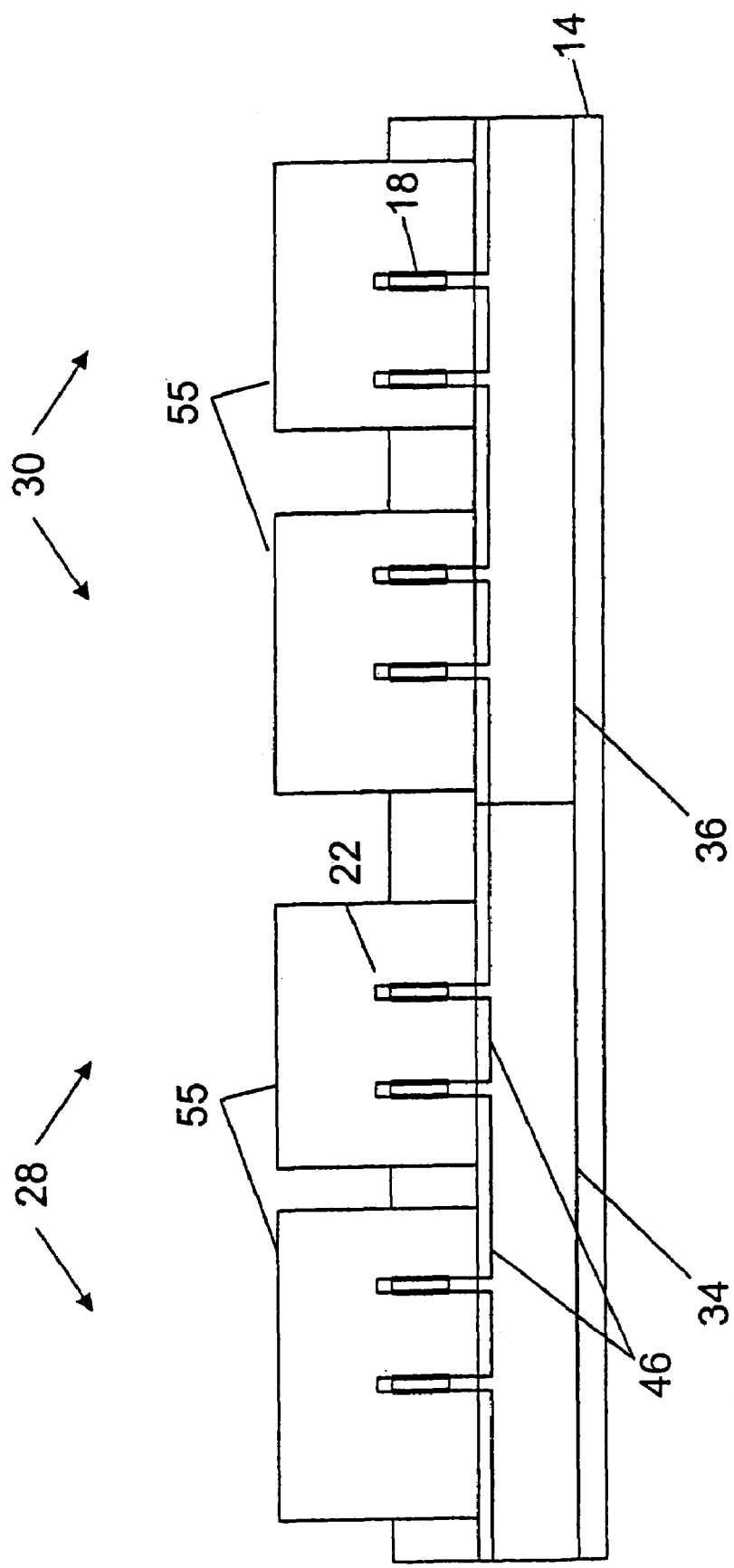

LOW CAPACITANCE JUNCTION-ISOLATION FOR BULK FINFET TECHNOLOGY

FIELD OF THE INVENTION

The present invention relates to a semiconductor device and a method of fabricating the same. More particularly, the present invention relates to a semiconductor structure including a FinFET in which low capacitance junction-isolation is provided as well as a method of fabricating the semiconductor structure including the FinFET.

BACKGROUND OF THE INVENTION

The dimensions of semiconductor field effect transistors (FETs) have been steadily shrinking over the last thirty 30 years or so, as scaling to smaller dimensions leads to continuing device performance improvements. Planar FET devices have a conducting gate electrode positioned above a semiconducting channel, and electrically isolated from the channel by a thin layer of gate oxide. Current through the channel is controlled by applying voltage to the conducting gate.

For a given device length, the amount of current drive for an FET is defined by the device width (w). Current drive scales proportionally to device width, with wider devices carrying more current than narrower devices. Different parts of integrated circuits (ICs) require the FETs to drive different amounts of current, i.e., with different device widths, which is particularly easy to accommodate in planar FET devices by merely changing the device gate width (via lithography).

With conventional planar FET scaling reaching fundamental limits, the semiconductor industry is looking at more unconventional geometries that will facilitate continued device performance improvements. One such class of devices is a FinFET.

A FinFET is a double gate FET in which the channel is a semiconducting "Fin" of width w and height h, where typically w<h. The gate dielectric and gate are positioned around the fin such that current flows down the channel on the two sides of the Fin (generally, FinFETs do not use the fin top surface as part of the conducting channel).

FinFET devices typically include a fully depleted body in the Fin that provides several advantages over a conventional FET. These advantages include nearly ideal turn off in sub-threshold voltages, giving lower off-currents and/or allowing lower threshold voltages, no loss to drain currents from body effects, no 'floating' body effects (often associated with some silicon-on-insulator (SOI) FETs), higher current density, lower voltage operation, and reduced short channel degradation of threshold voltage and off current. Furthermore, FinFETs are more easily scaled to smaller physical dimensions and lower operating voltages than conventional and SOI FETs.

Bulk FinFET integration schemes have been introduced in the prior art, but these prior art methods require expensive source/drain isolation schemes such as recessed shallow trench isolation (STI). In view of the foregoing, there is a need for providing a simple isolation scheme for a structure including a FinFET which is low cost, yet provides good n-to-n, p-to-p and n-to-p isolation.

SUMMARY OF THE INVENTION

The present invention provides a SiGe-based bulk integration scheme for generating FinFET devices on a bulk Si substrate in which a simple etch, mask, ion implant set of sequences have been added to accomplish good junction isolation while maintaining the low capacitance benefits of FinFETs.

Specifically, the method of the present invention includes the steps of:

providing a structure including a bottom Si layer and a patterned stack comprising a SiGe layer and a top Si layer on said bottom Si layer;

forming a well region and isolation regions via implantation within said bottom Si layer;

forming an undercut region beneath said top Si layer by etching back said SiGe layer; and filling said undercut with a dielectric to provide device isolation, wherein said dielectric has an outer vertical edge that is aligned to an outer vertical edge of said top Si layer.

The method of the present invention also includes the steps of:

forming a gate dielectric and a gate conductor on at least each vertical sidewall of a portion of said top Si layer; and forming source/drain regions in other portions of the top Si layer.

The present invention also provides a semiconductor structure that includes:

a bottom Si layer including a patterned stack comprises a SiGe layer and a top Si layer, said SiGe layer having a length that is less than that of the top Si layer;

a dielectric abutting said SiGe layer providing device isolation, said dielectric having a vertical outer edge that is aligned with a vertical outer edge of said top Si layer;

a gate dielectric and a gate conductor located at least on each vertical sidewall of at least a portion of said top Si layer; and source/drain diffusion regions located within other portions of the top Si layer.

BRIEF DESCRIPTION OF THE DRAWINGS

FIGS. 1A–1B are pictorial representations (through various views) illustrating an initial structure of the present invention in which a plurality of patterned resists are formed on a dielectric stack, which is located on top of a semiconductor stack comprising a SiGe layer sandwiched between two Si layers.

FIGS. 2A–2B are pictorial representations (through various views) showing the structure of FIGS. 1A–1B after transferring the pattern into the dielectric stack.

FIGS. 3A–3B are pictorial representations (through various views) showing the structure of FIGS. 2A–2B after the plurality of patterned resists have been removed therefrom.

FIGS. 5A–5B are pictorial representations (through various views) showing the structure of FIGS. 4A–4B after removing the top dielectric layer of the dielectric stack from the structure, leaving a trimmed bottom dielectric layer atop the semiconductor stack.

FIGS. 8A–8B are pictorial representations (through various views) showing the structure of FIGS. 7A–7B after a first isolation region is formed via a low energy implant into the device region including the previously formed first well region.

FIGS. 9A–9B are pictorial representations (through various views) showing the structure of FIGS. 8A–8B after a second well region is formed into the other FET device region, not including the previously formed first well region.

FIGS. 10A–10B are pictorial representations (through various views) showing the structure of FIGS. 9A–9B after a second isolation region is formed via a low energy implant into the device region including the previously formed second well region.

FIGS. 11A–11B are pictorial representations (through various views) showing the structure of FIGS. 10A–10B after etching back the SiGe layer.

FIGS. 12A–12B are pictorial representations (through various views) showing the structure of FIGS. 11A–11B after forming a conformal dielectric layer thereon.

FIGS. 13A–13B are pictorial representations (through various views) showing the structure of FIGS. 12A–12B after a directional etching step has been performed.

FIGS. 15A–15B are pictorial representations (through various views) showing the structure of FIGS. 14A–14B after the removal of any remaining hard mask material.

FIGS. 16A–16B are pictorial representations (through various views) showing the structure of FIGS. 15A–15B after partially filling the gaps between FinFET devices.

FIGS. 17A–17B are pictorial representations (through various views) showing the structure of FIGS. 16A–16B after forming source and drain regions for each of the FinFET devices.

FIGS. 18A–18M are pictorial representations (through cross sectional views) of the structures of FIGS. 1–17 illustrating the middle region of line A—A between the source/drain regions in which the actual FinFET device is formed.

DETAILED DESCRIPTION OF THE INVENTION

Figure 4A:
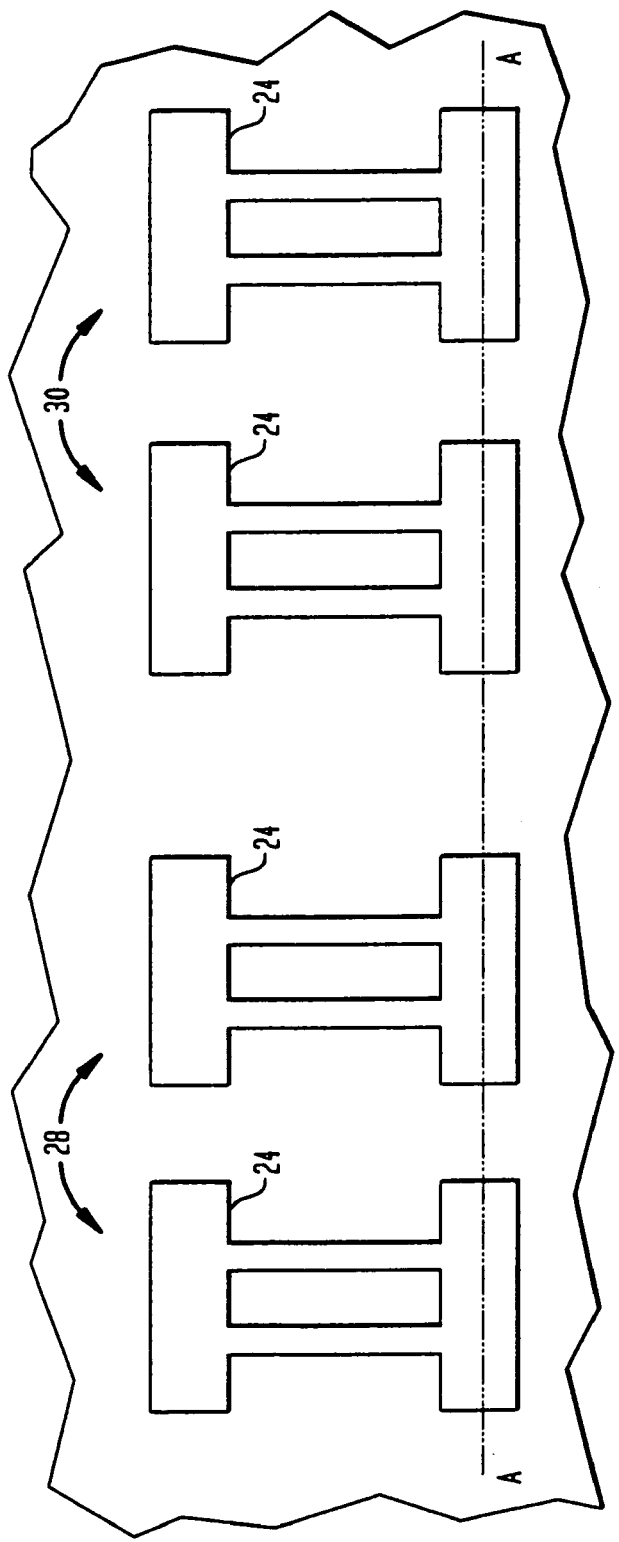
FIGS. 4A–4B are pictorial representations (through various views) showing the structure of FIGS. 3A–3B after performing an etching step that provides an undercut beneath the top dielectric layer of the dielectric stack.

The present invention, which provides a semiconductor structure including a FinFET in which low capacitance junction-isolation is provided, will now be described in greater detail by referring to the drawings that accompany the present application. It is noted that the drawings of the present application are provided for illustrative purposes and thus they are not drawn to scale. Moreover, the present invention is not limited to a specific number of, or conductivity type, FinFET that can be formed on a bulk semiconductor substrate. For example, it is possible to form an nFinFET or a plurality of nFinFETs, a pFinFET or a plurality of pFinFETs, an nFinFET and a pFinFET or a plurality of nFinFETs and pFinFETs on the same substrate using the method of the present invention. It is noted that in the drawings, a plurality of nFinFETs and a plurality of pFinFETs are shown.

Each of the drawings of the present invention includes a top down view shown in drawing "A" and a cross-sectional view shown in drawing "B". The top down view is a simplistic view. The cross sectional view is through the line A—A shown in the top down view. It is noted that line A—A is through one of the source/drain regions of the structure. The middle region of drawing A between the source/drain regions is the region in which the actual FinFET devices are formed.

Reference is first made to FIGS. 1A–1B which illustrate an initial structure 10 that is used in the present invention. As shown, the initial structure 10 includes a semiconductor stack 12, a dielectric stack 20 located on the semiconductor stack 12, and a plurality of patterned resists 26 located on the dielectric stack 20. Specifically, the semiconductor stack 12 of the initial structure 10 includes a bottom Si layer (which can be referred to herein as the Si substrate) 14, a SiGe layer 16 located on the bottom Si layer 14, and a top Si layer 18 located on the SiGe layer 16. As shown, the SiGe layer 16 is sandwiched between the two Si layers 14 and 18. Although Si layers 14 and 18 are described, the present invention also contemplates the use of other types of semiconducting materials for these layers, with the proviso that layers 14 and 18 are not comprised of SiGe.

The semiconductor stack 12 is formed by first providing the bottom Si layer 14. The bottom Si layer 14 is a bulk semiconductor substrate that is fabricated using techniques well known in the art. The bottom Si layer 14 may have any crystallographic orientation including, for example, (110), (100) or (111). The thickness of the bottom Si layer 14, which is inconsequential to the present invention, is typically within ranges normally associated with a standard substrate.

The SiGe layer 16 is formed atop the bottom Si layer 14 utilizing a conventional epitaxial growing process, which includes a Si source and a Ge source. The SiGe layer 16 formed has the same crystallographic orientation as that of the bottom Si layer 14. The thickness of the SiGe layer 16 may vary depending on the conditions of the epitaxial growth process. Typically, and by way of an example, the SiGe layer 16 has a thickness from about 5 to about 200 nm, with a thickness from about 10 to about 70 nm being even more typical.

The top Si layer 18 is formed on the SiGe layer 16 utilizing a conventional epitaxial growth process, which includes a Si source. Since epitaxy is used in this step as well, the top Si layer 18 also has the same crystallographic orientation as that of layers 16 and 14. It is noted that the SiGe layer 16 and the top Si layer 18 can be formed without breaking vacuum between the depositions. Alternatively, the two depositions may be performed by breaking vacuum between each of the deposition processes. The thickness of the top Si layer 18 may vary depending on the conditions of the epitaxial growing process. Typically, and by way of an example, the top Si layer 18 of the semiconductor stack 12 has a thickness from about 10 to about 200 nm, with a thickness from about 20 to about 70 nm being even more typical.

The dielectric stack 20 shown in FIGS. 1A–1B includes a bottom dielectric layer 22 and a top dielectric layer 24. In accordance with the present invention, the two dielectrics of the dielectric stack 20 are composed of different dielectric materials. Specifically, the bottom dielectric layer 22 is comprised of $SiO_2$, while the top dielectric layer 24 is comprised of $Si_3N_4$. Other materials that could be used include boron nitride as layer 24 and aluminum oxide as layer 22.

The bottom dielectric layer 22 of the dielectric stack 20 is formed utilizing a conventional deposition process including, for example, chemical vapor deposition (CVD), plasma enhanced chemical vapor deposition (PECVD), atomic layer deposition (ALD), evaporation, chemical solution deposition or other like deposition processes. Alternatively, the bottom dielectric layer 22 can be formed by a thermal growth process such as, for example, oxidation. The bottom dielectric layer 22 of the dielectric stack 20 has a thickness that is typically less than that of the top dielectric layer 24. Typically, the thickness of the bottom dielectric 22 is from about 2 to about 100 nm, with a thickness from about 4 to about 15 nm being even more typical.

The top dielectric layer 24 of the dielectric stack 20 is formed utilizing one of the above-mentioned deposition processes used in forming the bottom dielectric layer 22. Alternatively, the top dielectric layer 24 can be formed by a thermal growth process such as nitridation. The thickness of the top dielectric layer 24 is typically from about 4 to about 200 nm, with a thickness from about 15 to about 100 nm being even more typical.

After providing the semiconductor stack 12 and the dielectric stack 20, a plurality of patterned resists 26 are formed on the dielectric stack 20 utilizing conventional deposition and lithography. Specifically, the patterned resists 26 are formed by first depositing, via spin-on coating or another like deposition process, a blanket layer of resist material on the dielectric stack 20. After the deposition step, the blanket layer of resist material is patterned by exposing the resist material to a predetermined pattern of radiation and thereafter the exposed resist is developed utilizing a conventional developer solution. As shown in FIG. 1B, the patterned resists 26 protect portions of the dielectric stack 20, while leaving other portions of the dielectric stack 20 unprotected.

It is noted that the initial structure 10 shown in FIGS. 1A and 1B may be divided into an nFinFET device region 28 and a pFinFET device region 30.

Next, and as shown in FIGS. 2A–2B, the exposed portions of the dielectric stack 20, not protected by a patterned resist 26, are removed to expose the underlying top Si layer 18. Specifically, the unprotected portions of the dielectric stack 20 are removed utilizing an etching process that selectively removes dielectric material as compared to a semiconductor. An example of such an etching process includes reactive-ion etching.

Following the above etching step, the patterned resists 26 are removed from the structure providing the structure shown in FIGS. 3A–3B. Specifically, a conventional resist stripping process can be used in removing the patterned resists 26 from the structure. As shown in FIGS. 3A–3B, the remaining dielectric stack 20 is now patterned with the resist pattern.

Figure 4B:
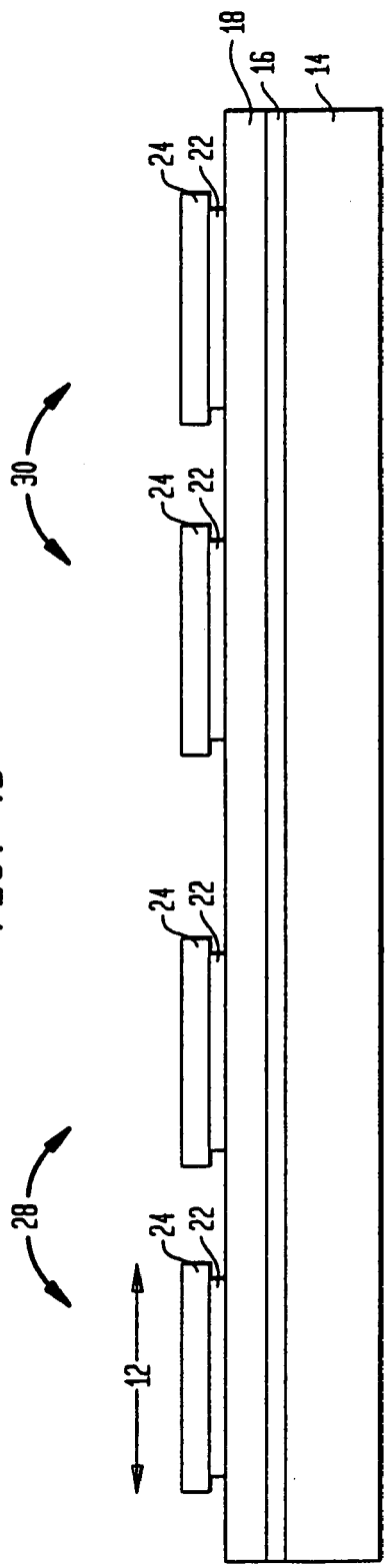

After removing the patterned resists 26 from the structure, an etching step is performed that undercuts the top dielectric layer 24 of the remaining dielectric stack 20. The resultant structure that is formed after this etching step has been performed is shown, for example, in FIGS. 4A–4B. Specifically, the etching step removes the exposed sidewalls of the bottom dielectric layer 22 such that the length $l_1$ of the bottom dielectric layer 22 is less than the length $l_2$ of the top dielectric layer 24. When the bottom dielectric layer 22 is an oxide, the undercutting can be performed utilizing a chemical oxide removal (COR) process. The COR process employed in the present invention is typically carried out at a relatively low pressure (on the order of about 6 millitorr or less) in a vapor, or more preferably, a plasma of HF and $NH_3$. The HF and $NH_3$ mixture is used as an etchant that selectively removes oxide from the structure. In addition to the COR process described above, other etching processes that can provide the undercut including any anisotropic etching process may also be employed in the present invention.

Next, and as shown in FIGS. 5A–5B, the remaining top dielectric layer 24 is removed from the structure utilizing an etching process that selectively removes nitride as compared to oxide or semiconductor material. Specifically, the remaining top dielectric layer 24 is removed utilizing reactive-ion etching, or by hot-phosphoric acid etching. As shown in these drawings, the remaining trimmed bottom dielectric layer 22 protects portions of the semiconductor stack 20, while leaving other portions of the semiconductor stack 20 unprotected.

Figure 6A:
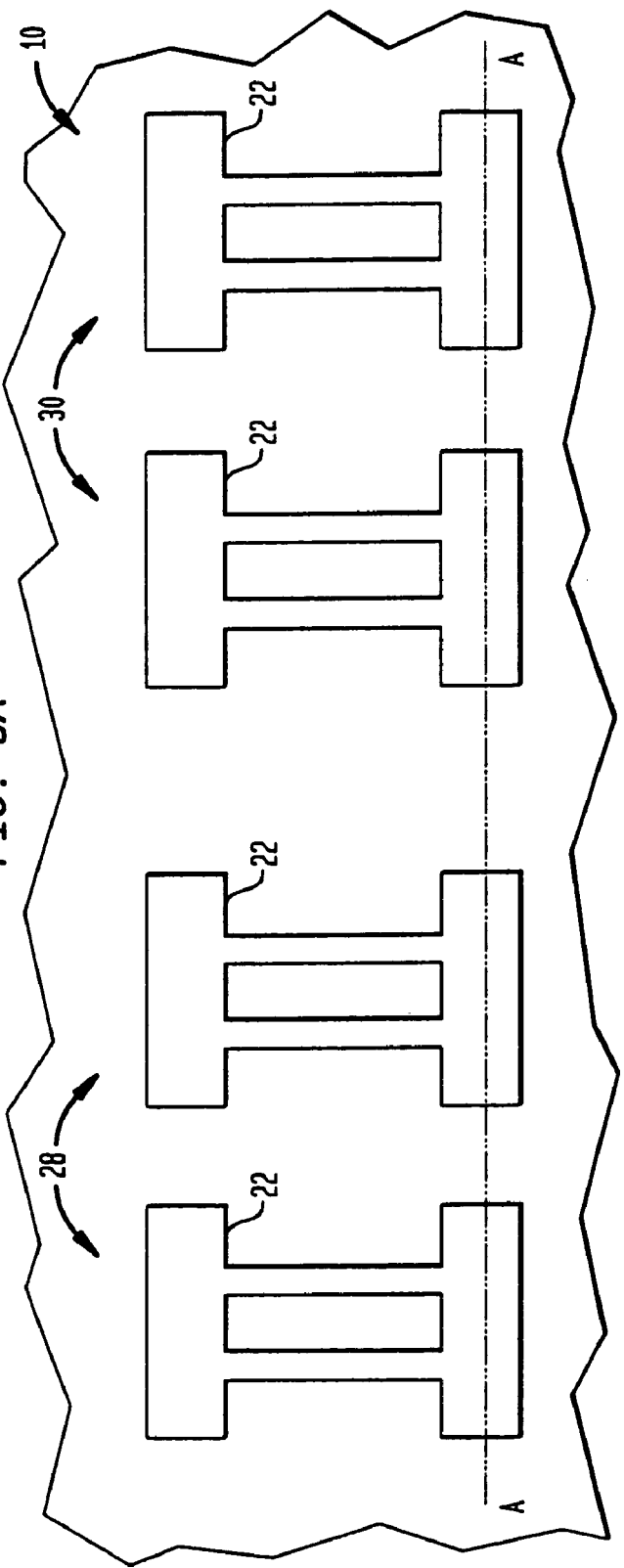
FIGS. 6A–6B are pictorial representations (through various views) showing the structure of FIGS. 5A–5B after etching the top Si layer and the underlying SiGe using the trimmed bottom dielectric layer as a pattern mask.
Figure 6B:
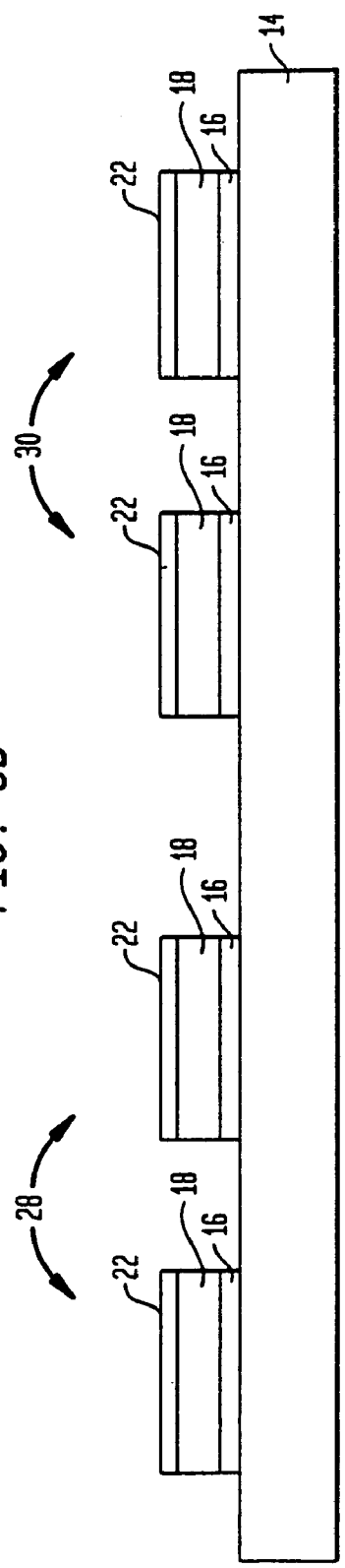

Following the removal of the remaining top dielectric layer 24 from the structure, the exposed top Si layer 18 and the underlying SiGe layer 16 of the semiconductor stack 20 are removed using the remaining and trimmed bottom dielectric layer 22 as a mask. The resultant structure that is formed after the selective removal of the exposed portions of the top Si layer 18 and the underlying SiGe layer 16 is shown, for example, in FIGS. 6A–6B. Specifically, the selective removal of the exposed portions of the top Si layer 18 and the underlying SiGe layer 16 is performed utilizing a timed etching process such as reactive ion etching, ion beam etching, plasma etching or a chemical wet etch process.

Figures 7A, 7B:
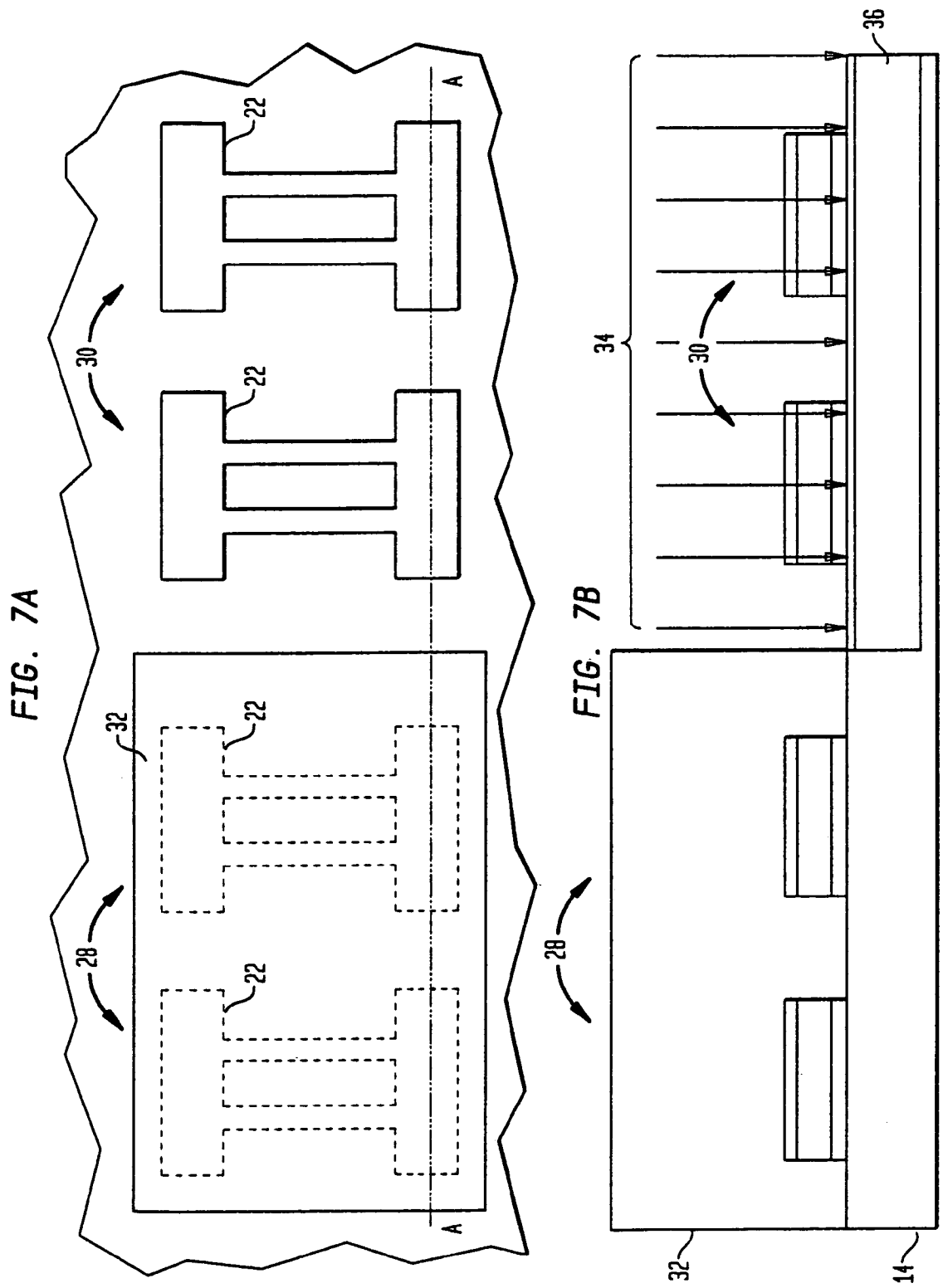
FIGS. 7A–7B are pictorial representations (through various views) showing the structure of FIGS. 6A–6B after a first well region is formed into one of the FET device regions.

At this point of the present invention, well regions and isolation regions are formed. It is noted that the order of forming the different conductivity type well regions and the isolation regions into the various FinFET regions may be reversed from that illustrated and described herein. In the specific embodiment illustrated, a block mask 32 is formed over the nFinFET region 28 so as to protect that region from receiving the various implants for well formation and isolation formation in the pFinFET region 30. The block mask 32 is comprised of a conventional mask material that inhibits the penetration of ions into the blocked region during a subsequent implantation process. The structure including the block mask 32 formed over the nFinFET region 28 is shown in FIGS. 7A–7B. These drawings also show the implantation of n-type dopants (such as phosphorus) 34 into the pFinFET region 30 which, in turn, form n-well region 36 into the bottom Si layer 14.

The n-well region 36 is formed using a high-energy implantation process in which the energy of the implantation is typically about 200 keV or greater and the dose of n-type dopant is about $10^{13}$ cm$^{-2}$ or greater. Typically, the implantation used in forming the n-well region 36 into the pFinFET region 30 is from about 250 keV to about 400 keV and the ion dose is typically from about $10^{13}$ to about $10^{14}$ cm$^{-2}$.

Following the formation of the n-well region 36, a second ion implantation process is performed in the exposed pFinFET region 30 to form n-type isolation regions 38 within the surface of the bottom Si layer 14 at the footprint of the remaining layers 16, 18 and 22. Note that in this second implantation step the energy is lower than the energy used in forming the n-well region 36. The use of a lower energy implantation process permits the formation of the n-type isolation regions 38 at the footprint of remaining layers 16, 18 and 22, and is prevented from doping source/drain regions 18 by regions 22.

The structure during the second ion implantation process into the pFinFET region 30 is shown in FIGS. 8A–8B. In these drawings, reference numeral 40 denotes the n-type dopant being implanted into the exposed Si layer 12 within the pFinFET region 30.

As stated above, the n-isolation regions 38 are formed using a low-energy implantation process (as compared with the implant energy used in forming the n-well region 36) in which the energy of the implantation is typically about 10 keV or less and the dose of n-type dopant is about $10^{14}$ cm$^{-2}$ or greater. Typically, the implantation used in forming the n-isolation regions 38 into the pFinFET region 30 is from about 1 to about 5 keV and the ion dose is typically from about $1\times10^{13}$ to about $5\times10^{14}$ cm$^{-2}$. The ions 40 used in forming the n-isolation regions 38 are n-type dopant ions that are typically different than the ions used in forming the well region 36. For example, when the n-well region 36 is formed using phosphorus, then the n-isolation regions 38 are formed using arsenic.

At this point of the present invention the block mask 32 is removed from the nFinFET region 28 and a second block mask 32' is formed over the pFinFET region 30 that now includes n-well region 36 and n-isolation regions 38. The structure including the block mask 32' formed over the pFinFET region 30 is shown in FIGS. 9A–9B. These drawings also show the implantation of p-type dopants (such as boron) 42 into the nFinFET region 28, which, in turn, form p-well region 44 into the bottom Si layer 14.

The p-well region 44 is formed using a high-energy implantation process in which the energy of the implantation is typically about 200 keV or greater and the dose of n-type dopant is about $10^{13}$ cm$^{-2}$ or greater. Typically, the implantation used in forming the p-well region 44 into the nFinFET region 28 is from about 250 to about 350 keV and the ion dose is typically from about $1\times10^{13}$ to about $5\times10$ cm$^{-2}$.

Following the formation of the p-well region 44, a second ion implantation process is performed in the exposed nFinFET region 28 to form p-type isolation regions 46 within the surface of the bottom Si layer 14 at the footprint of the remaining layers 16, 18 and 22. Note that in this second implantation step the energy is lower than the energy used in forming the p-well region. The use of a lower energy implantation process permits the formation of the p-type isolation regions 46 at the footprint of remaining layers 16, 18 and 22.

The structure during the second ion implantation process into the nFinFET region 28 is shown in FIGS. 10A–10B. In these drawings, reference numeral 48 denotes the p-type dopant being implanted into the exposed Si layer 12 within the nFinFET region 28.

As stated above, the p-isolation regions 46 are formed using a low-energy implantation process (as compared with that implantation of the p-well region 44) in which the energy of the implantation is typically about 7 keV or less and the dose of p-type dopant is about $10^{14}$ cm$^{-2}$ or greater. Typically, the implantation used in forming the p-isolation regions 46 into the nFinFET region 28 is from about 0.5 to about 5 keV and the ion dose is typically from about $1\times10^{14}$ to about $5\times10^{14}$ cm$^{-2}$. The ions 48 used in forming the p-isolation regions 46 are p-type dopant ions that are typically different than the ions used in forming the well region 44. For example, when the p-well region 44 is formed using B, then the p-isolation regions 46 are formed using BF$_2$.

Following the formation of the p-well region 44 and the p-isolation regions 46, the block mask 32' is removed from the pFinFET region 30 utilizing a conventional stripping process well known to those skilled in the art. Next, an etch back process is performed to trim the length of the remaining SiGe layer 16 to length $l_3$. Note that $l_3$ is less than the length of the patterned SiGe layer 16 shown in the drawings described above. The structure including the etched back SiGe layer 16 is shown in FIGS. 11A–11B.

The etch back process used for trimming the patterned SiGe layer 16 to length $l_3$ includes any anisotropic etching process that selectively removes SiGe. For example, the etch back process can be performed using HF:H$_2$O$_2$:CH$_3$COOH.

Next, and as shown in FIGS. 12A–12B, a conformal dielectric layer 50 is formed over all of the exposed surfaces (horizontal and vertical) of the structure. The conformal dielectric layer 50 comprises a nitride, an oxide or an oxynitride, with nitride being highly preferred in the present invention. The conformal dielectric layer 50 is formed by a conventional deposition process such as CVD and the thickness of layer 50 may vary depending on the type of dielectric material employed as well as the deposition process that is used in forming the same. Typically, and by way of an example, the thickness of the conformal dielectric layer 50 is from about 3 to about 150 nm, with a thickness from about 7 to about 50 nm being even more typical. It is noted that the conformal dielectric layer 50 fills in the space, i.e., undercut, created underneath the remaining top Si layer 18 during the etch back of the SiGe layer 16.

FIGS. 13A–13B show the structure that is formed after performing a directional etching process that removes the majority of the conformal dielectric layer 50 from the structure, yet leaving the conformal dielectric layer 50 within the space created by the SiGe etch back step. The directional etching process that is employed in the present invention includes, for example, reactive ion etching. As shown in these drawings, the directional etch provides a structure in which the remaining dielectric 50 abutting the SiGe layer 16 has a vertical outer edge that is aligned with a vertical outer edge of the top Si layer 18. The remaining dielectric 50 provides isolation for the FinFETs formed in the present invention.

Figure 14A:
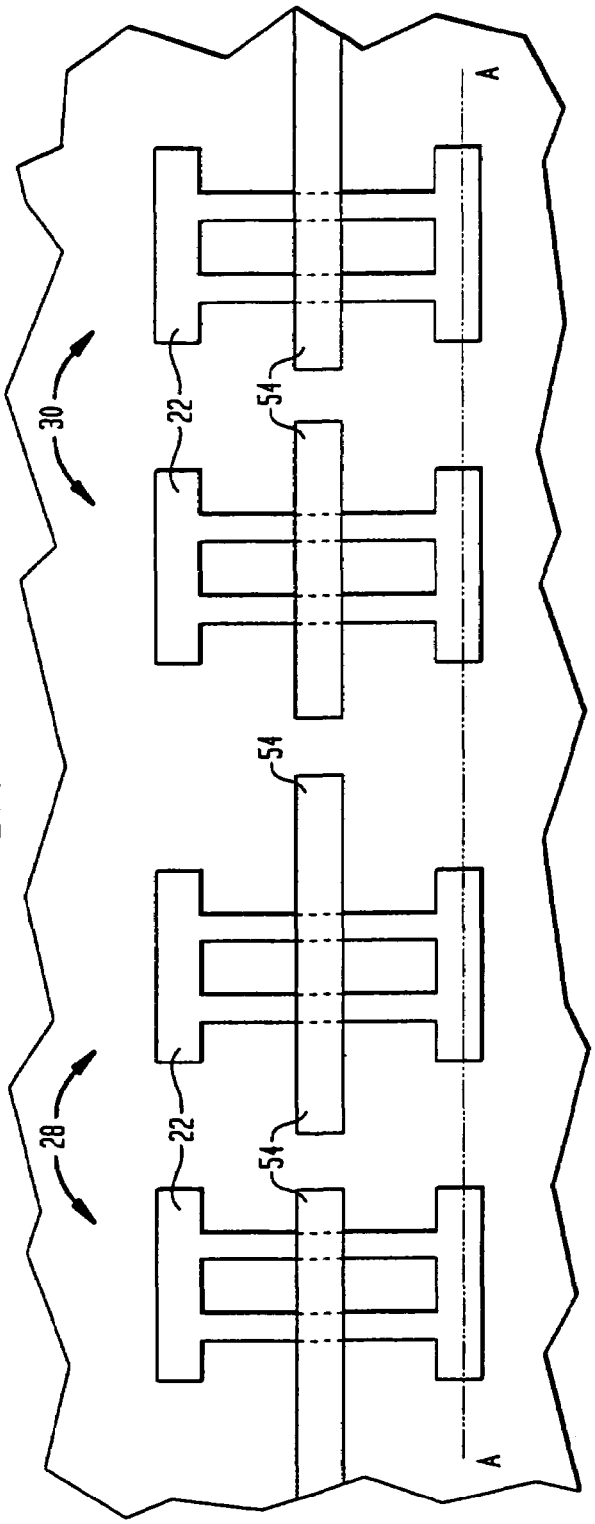
FIGS. 14A–14B are pictorial representations (through various views) showing the structure of FIGS. 13A–13B after the formation of a gate dielectric and a gate conductor and hence the FinFET devices.
Figure 14B:
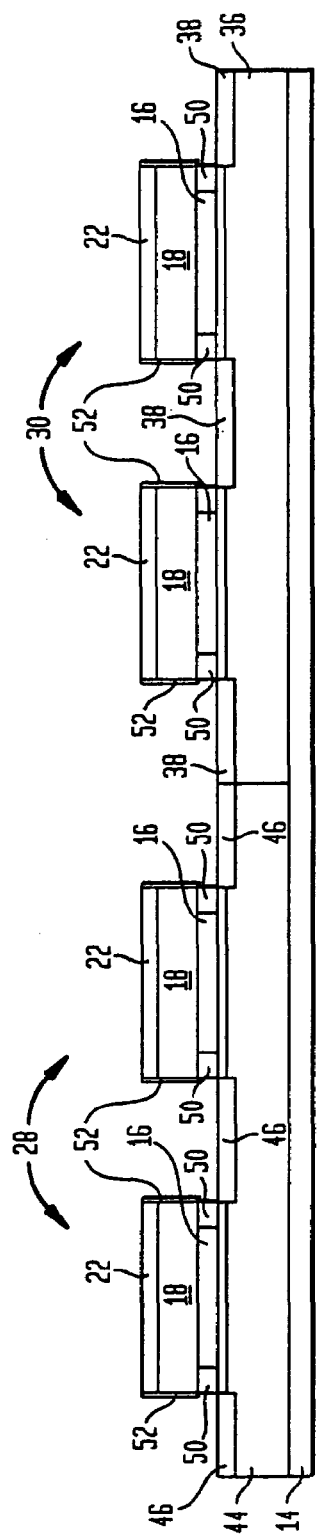

Next, the gate dielectric and the gate conductor of each FinFET are formed. Reference is made to FIGS. 14A–14B wherein gate conductor 54 is shown in the top down view and a portion of dielectric 52 which is the same material as the gate dielectric is shown in the cross sectional view. It is noted that the actual gate dielectric would be beneath the gate conductor 54 shown in FIG. 14A.

The gate dielectric and dielectric 52 are comprised of SiO$_2$, SiON, a high k dielectric having a dielectric constant greater than 4.0, preferably greater than 7.0, or multilayers thereof such as SiO$_2$ and a high k gate dielectric. The high k gate dielectric may include a metal oxide or a mixed metal oxide having a dielectric constant within the range described above. Some examples of high k gate dielectrics that can be used in the present invention include, but are not limited to: HfO$_2$, ZrO$_2$, Al$_2$O$_3$, TiO$_2$, La$_2$O$_3$, SrTiO$_3$, LaAlO$_3$, CeO$_2$, Y$_2$O$_3$ or multilayers thereof.

The gate dielectric can be formed by a conventional deposition process such as, for example, CVD, PECVD, ALD, metalorganic chemical vapor deposition (MOCVD), evaporation, reactive sputtering, chemical solution deposition or other like deposition processes. Alternatively, the gate dielectric can be formed by a thermal process. The physical thickness of the gate dielectric may vary, but typically, the gate dielectric has a thickness from about 0.7 to about 100 nm, with a thickness from about 1 to about 7 nm being even more typical.

Depending on the type of gate dielectric and the method that is used in forming the same, the gate dielectric may wrap around the top Si layer 18 in the device area or it may be located on just the vertical sidewalls of at least the top Si layer 18.

After forming the gate dielectric, the gate conductor 54 (See FIG. 14A) is formed utilizing a conventional deposition process including, for example, CVD, PECVD, ALD, MOCVD, chemical solution deposition, reactive sputtering, platting, evaporation or other like deposition processes. The gate conductor 54 comprises any conductive material including, for example, doped polySi, doped SiGe, a conductive elemental metal, an alloy of a conductive elemental metal, a nitride or silicide of a conductive elemental metal or multilayers thereof. When multilayers are used, a diffusion barrier (not shown) can be formed between each of the conductive layers. It is noted that when polySi or SiGe is employed, doping thereof may occur utilizing an in-situ doping deposition process, or deposition followed by ion implantation.

The thickness of the gate conductor 54 may vary depending on the type of material used as well as the process that was used in forming the same. Typically, and for illustrative purposes, the gate conductor has a thickness from about 10 to about 400 nm, with a thickness from about 70 to about 150 nm being even more typical.

FIGS. 15A and 15B show the structure after the remaining bottom dielectric layer 22 and the dielectric 52 are removed from the structure to expose the top Si layer 18 that is located within the source/drain regions. Specifically, the remaining bottom dielectric layer 22 and dielectric layer 52 are removed in the source and drain ('source/drain') regions utilizing an etching process that selectively removes oxide. An example of such a selective etching process is etching with hydrofluoric acid.

FIGS. 16A–16B show the structure after partially filling the gaps between the FinFET devices with an oxide 55. The oxide 55 is formed by utilizing a high plasma density deposition process and the height of the oxide 55 can be adjusted below that of the height of each finFET subjecting the same to a conventional oxide recess process.

Next, and as shown in FIGS. 17A–17B, source and drain regions 56 are formed into the exposed portions of the top Si layer 18 (not including the gate dielectric and gate conductor in the device area) for each of the FinFET devices. The source and drain regions 56 are formed by utilizing a block mask (not shown) to protect one of the FinFET devices, while implanting an appropriate type dopant (n-type for the nFinFET device and p-type for the pFinFET device) into the exposed portions of the top Si layer 18. Following this step, the block mask is removed and the above procedure is repeated to form the source and drain regions for the other FinFET device. An anneal step may follow each implant, or a single anneal may be used in activating all of the source and drain regions.

Figure 18A:
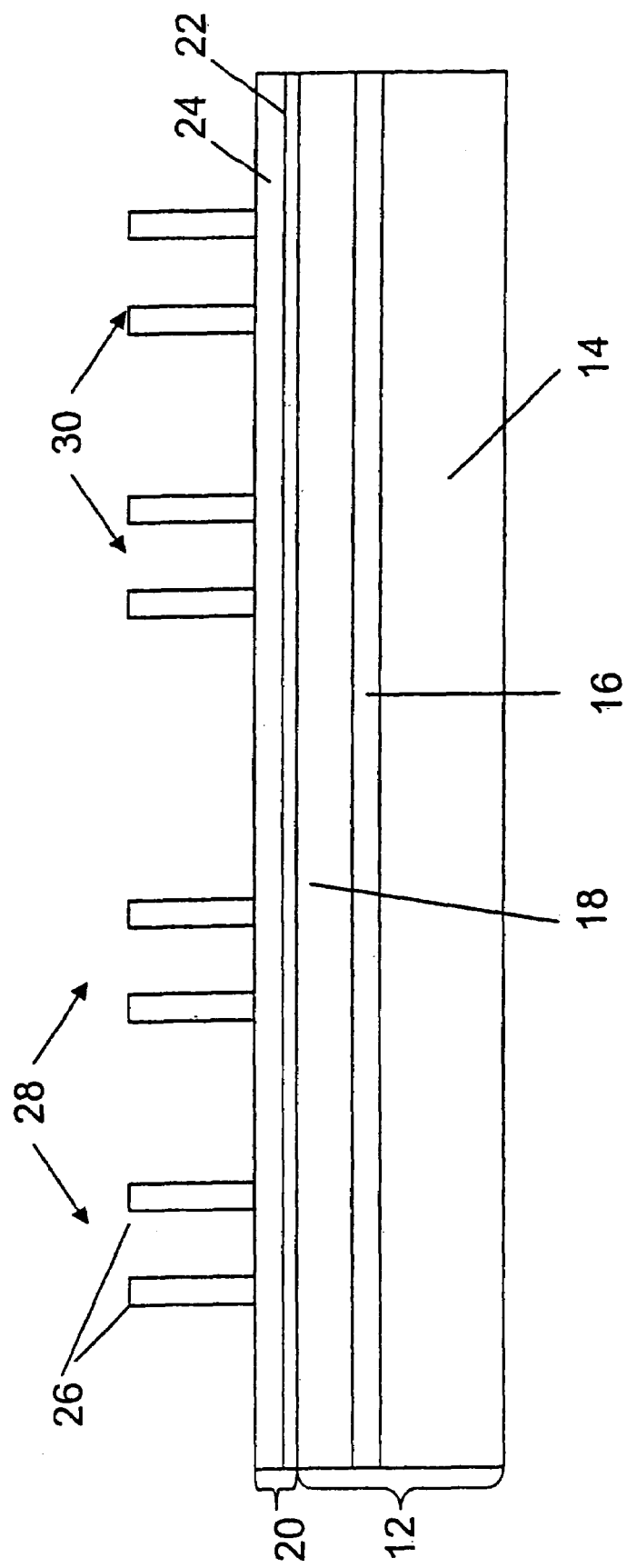
Figure 18B:
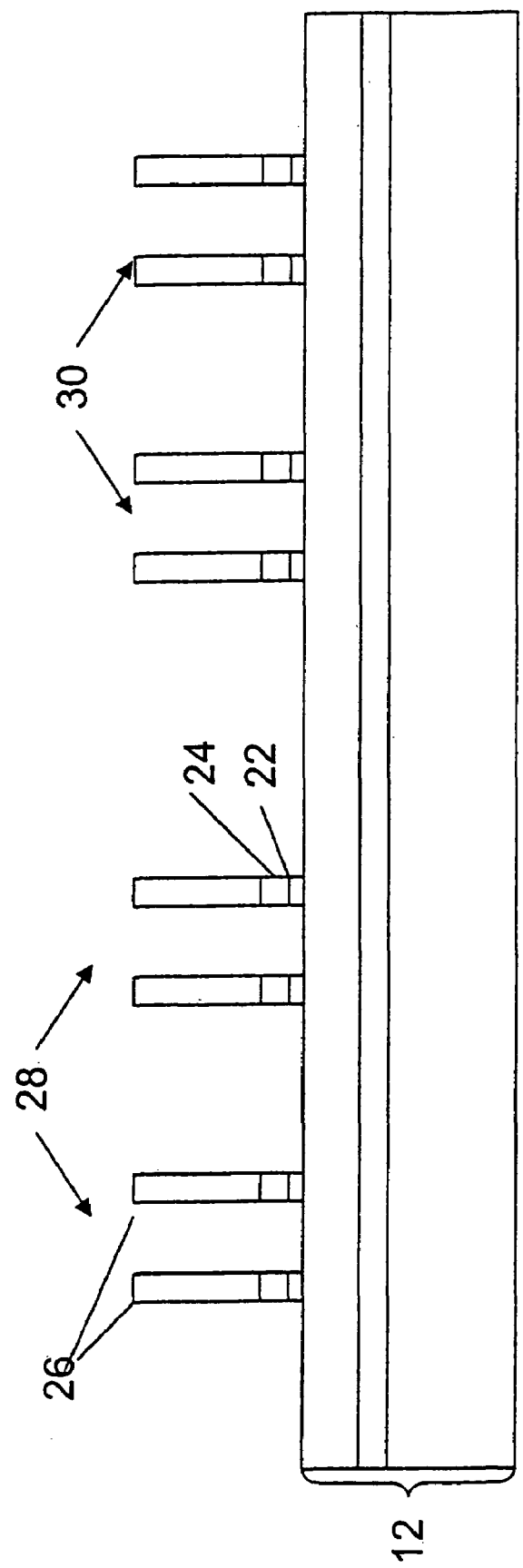
Figure 18E:
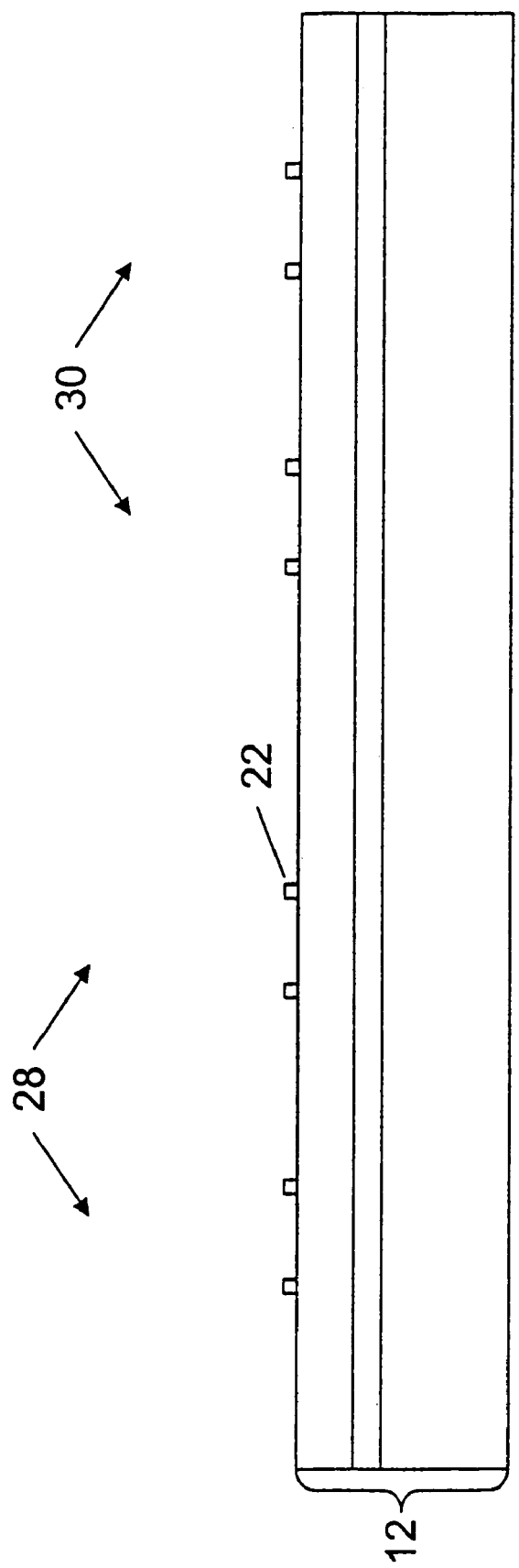
Figure 18F:
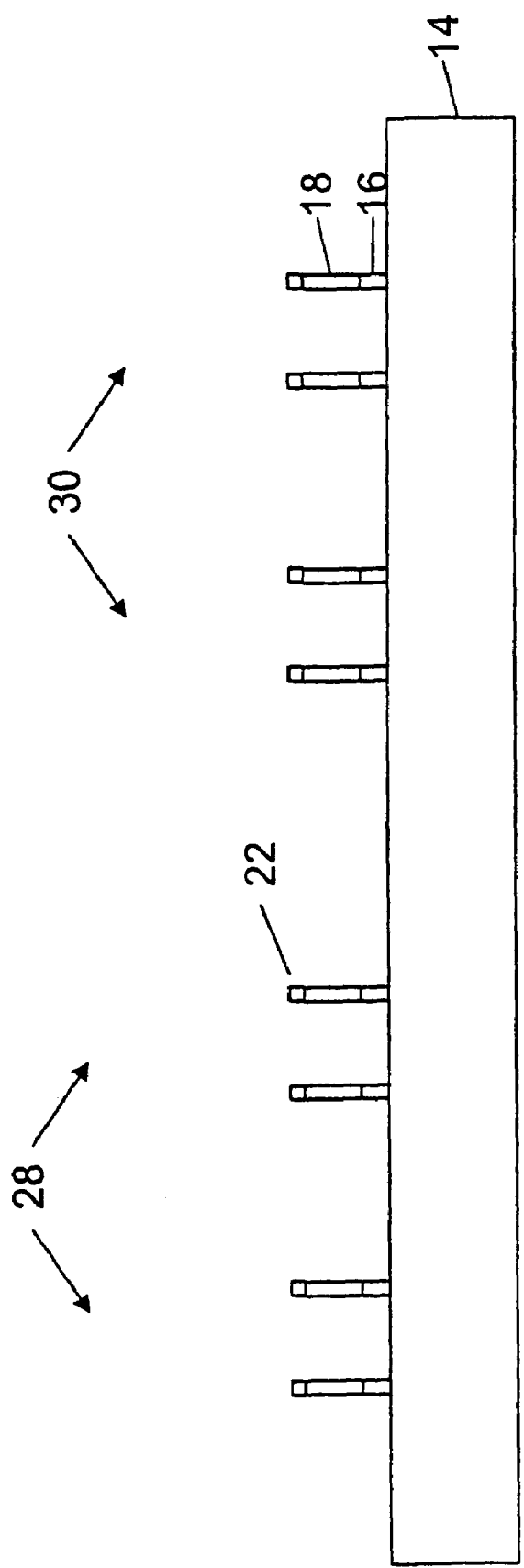
Figure 18H:
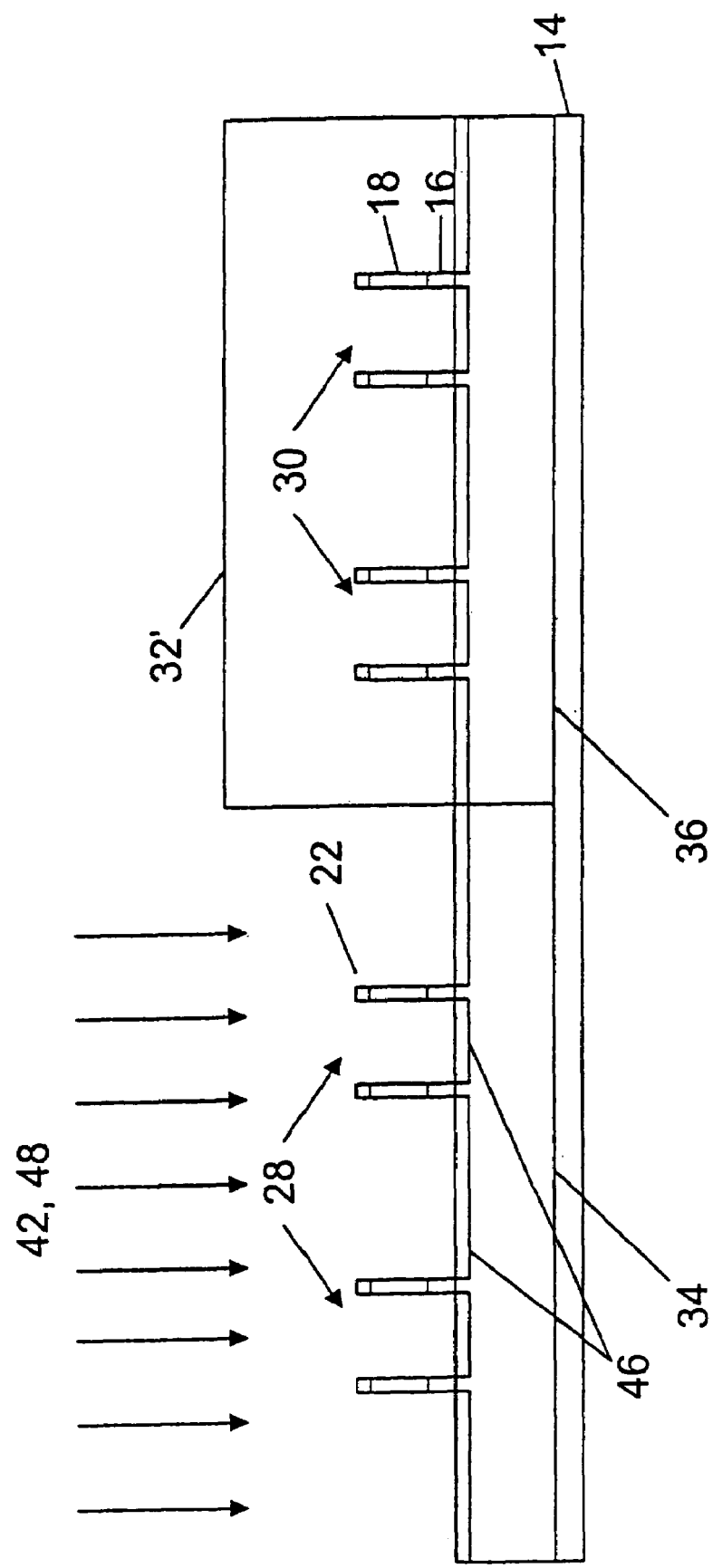
Figure 18I:
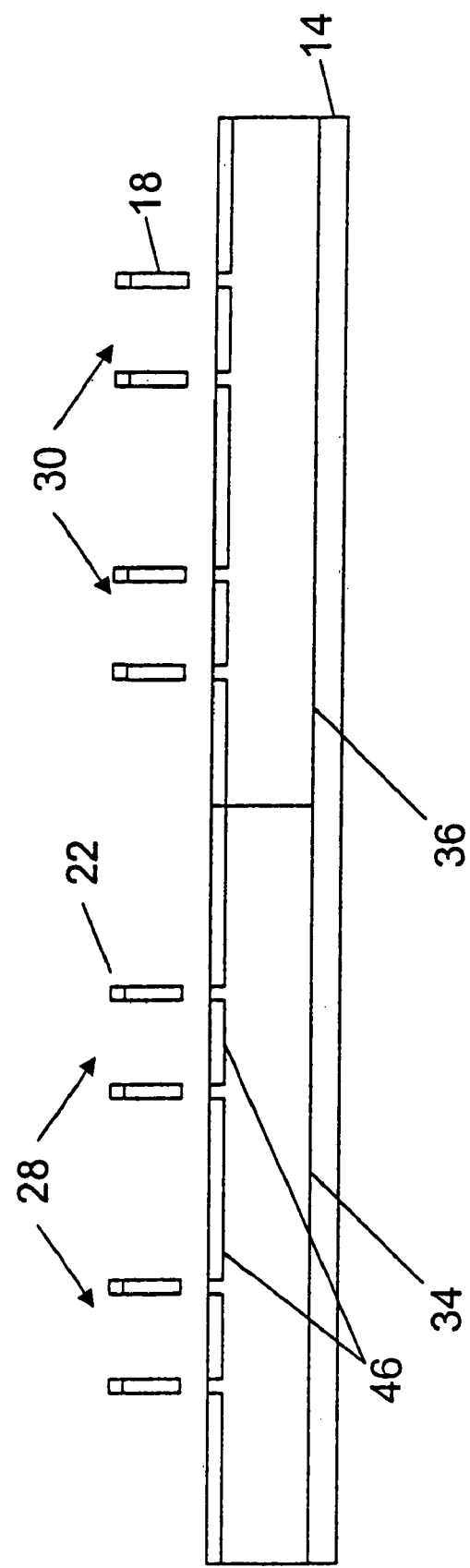
Figure 18J:
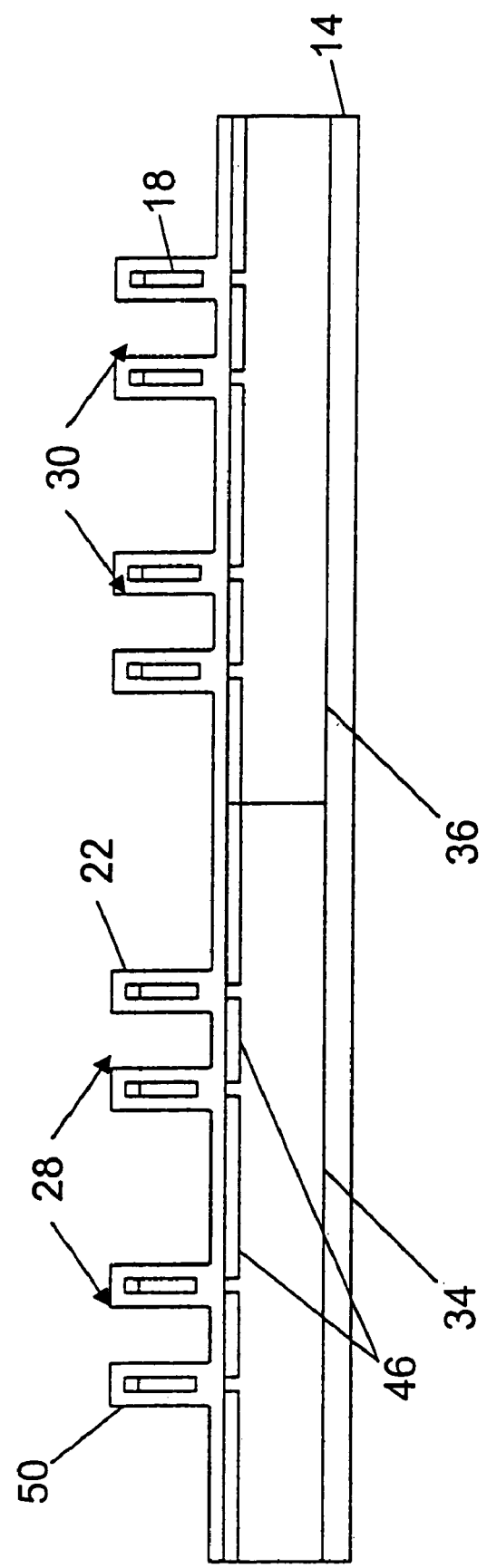
Figure 18L:
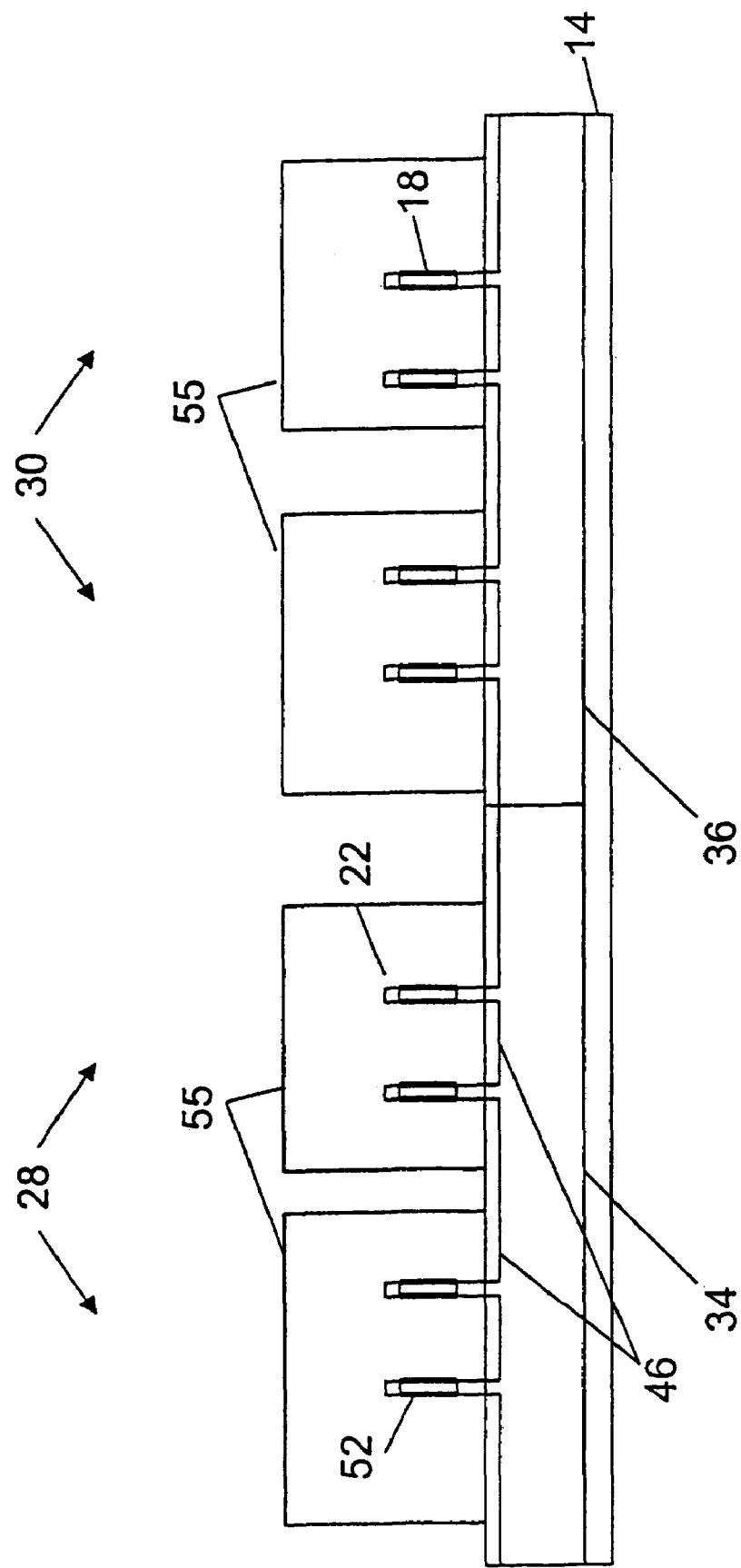

Reference is made to FIGS. 18A–18M which are cross sectional views of the structures shown in FIGS. 1–17 at the middle region of line A—A that is located between the source/drain regions in which the FinFET device is present. In particular, FIGS. 18A–18F corresponding to FIGS. 1–6, FIG. 18G corresponds with FIGS. 7 and 8, FIG. 18H corresponds with FIGS. 9–10, FIGS. 18I–18K correspond with FIGS. 11–12, FIG. 18L corresponds with FIGS. 14–15, and FIG. 18M corresponds with FIG. 17. It is noted that the reference numerals mentioned in FIGS. 18A–18M are the same as those described above. That is, in the drawings like elements are referred to with like reference numerals for the elements shown in FIGS. 1–17. It is further noted that in FIG. 18I the finFET/hard mask structures (combinations of 18 and 22) are supported by the source/drain regions shown in FIG. 11A–11B, yet they appear floating in the middle of line A—A. Also, in FIG. 18L, the dielectric 52 is only shown on the Si fin sidewalls, while in corresponding FIG. 14B, dielectric 52 is on layers 18 and 22. The exact location of dielectric 52 may vary depending on the process used in forming the same. FIGS. 14B and 18L show different embodiment of the same structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising:
   providing a structure including a bottom Si layer and a patterned stack comprising a SiGe layer and a top Si layer on said bottom Si layer;
   implanting a well region and isolation regions within said bottom Si layer;
   forming an undercut region beneath said top Si layer by etching back said SiGe layer; and
   filling said undercut with a dielectric to provide device isolation, wherein said dielectric has an outer vertical edge that is aligned to an outer vertical edge of said top Si layer.

2. The method of claim 1 further comprising:
   forming a gate dielectric and a gate conductor on at least each vertical sidewall of a portion of said top Si layer; and
   forming source/drain regions in other portions of the top Si layer.

3. The method of claim 1 wherein said patterned stack is formed by epitaxially growing said SiGe layer and said top Si layer, forming a dielectric stack comprising top and bottom dielectric layers on said top Si layer, forming a patterned resist on said dielectric stack, etching exposed portions of the dielectric stack stopping on said top Si layer, removing said patterned resist, providing an undercut region beneath the top dielectric layer so that the bottom dielectric layer has a length that is less than the length of the top dielectric layer, removing the top dielectric, and etching the exposed top Si layer and the underlying SiGe layer not protected by said bottom dielectric layer.

4. The method of claim 1 wherein said implanting comprises forming a first conductivity type well region and first conductivity type isolation regions in a portion of said bottom Si layer and then forming a second conductivity type well region and second conductivity type isolation regions in another portion of the bottom Si layer.

5. The method of claim 4 wherein said first conductivity type is n-type and said implanting of said n-well region is performed at an energy of about 200 keV or greater and the implanting of the n-isolation regions is performed at an energy of about 2 keV.

6. The method of claim 4 wherein said second conductivity type is p-type and said implanting of said p-well region is performed at an energy of about 200 keV or greater and the implanting of the p-isolation regions is performed at an energy of about 2 keV.

7. The method of claim 1 wherein forming said undercut region comprises an anisotropic etching step.

8. The method of claim 1 wherein said filling said undercut with a dielectric comprises a conformal deposition process followed by directional etching.

9. The method of claim 2 wherein said gate conductor, said gate dielectric and a portion of said top Si layer form at least one FinFET device, said at least one FinFET device comprises at least one nFinFET or at least one pFinFET.

10. The method of claim 9 wherein said at least one FinFET device comprises a plurality of pFinFETs and a plurality of nFinFETs.

11. A SiGe-based FinFET structure comprising
a bottom Si layer including a patterned stack comprises a SiGe layer and a top Si layer, said SiGe layer having a length that is less than that of the top Si layer;
a dielectric abutting said SiGe layer providing device isolation, said dielectric having a vertical outer edge that is aligned with a vertical outer edge of said top Si layer;
a gate dielectric and a gate conductor located at least on each vertical sidewall of at least a portion of said top Si layer; and
source/drain diffusion regions located within other portions of the top Si layer.

12. The SiGe-based FinFET structure of claim 11 wherein said bottom Si layer, said SiGe layer and said top Si layer are all of the same crystallographic orientation.

13. The SiGe-based FinFET structure of claim 11 wherein said dielectric is a nitride, an oxide, or an oxynitride.

14. The SiGe-based FinFET structure of claim 11 wherein said gate dielectric comprises $SiO_2$, SiON, a high dielectric constant dielectric having a dielectric of greater than 4.0 or multilayers thereof.

15. The SiGe-based FinFET structure of claim 11 wherein said gate conductor comprises doped polysilicon, doped SiGe, a conductive elemental metal, an alloy of a conductive elemental metal, a nitride of a conductive elemental metal, a silicide of a conductive elemental metal or multilayers thereof.

16. The SiGe-based FinFET structure of claim 11 wherein said gate dielectric and said gate conductor wrap around a portion of said top Si layer.

17. The SiGe-based FinFET structure of claim 11 wherein said gate conductor, said gate dielectric and a portion of said top Si layer form at least one nFinFET or pFinFET.

18. The SiGe-based FinFET structure of claim 17 wherein said gate conductor, said gate dielectric and a portion of said top Si layer form an nFinFET and a pFinFET.

19. The SiGe-based FinFET structure of claim 18 wherein said nFinFET and said pFinFET are separated by a recessed oxide that is located between said nFinFET and said pFinFET.

20. The SiGe-based FinFET structure of claim 17 wherein said nFinFET includes a n-well region and n-isolation regions located in said bottom Si layer and said pFinFET includes a p-well region and p-isolation regions located in said bottom Si layer.

* * * * *